(12) United States Patent
Ikemiya et al.

(10) Patent No.: US 10,106,413 B2
(45) Date of Patent: Oct. 23, 2018

(54) AGGLOMERATED BORON NITRIDE PARTICLES, PRODUCTION METHOD FOR AGGLOMERATED BORON NITRIDE PARTICLES, RESIN COMPOSITION INCLUDING AGGLOMERATED BORON NITRIDE PARTICLES, MOULDED BODY, AND SHEET

(71) Applicant: MITSUBISHI CHEMICAL CORPORATION, Chiyoda-ku (JP)

(72) Inventors: Katsura Ikemiya, Yokohama (JP); Masanori Yamazaki, Yokohama (JP); Takuya Suzuki, Yokohama (JP); Kazuki Takeda, Inashiki-gun (JP); Toshiyuki Sawamura, Yokohama (JP); Sawa Hiramatsu, Yokohama (JP); Tatsushi Isojima, Yokohama (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 1 day.

(21) Appl. No.: 15/229,619

(22) Filed: Aug. 5, 2016

(65) Prior Publication Data
US 2016/0340191 A1 Nov. 24, 2016

Related U.S. Application Data

(63) Continuation of application No. PCT/JP2015/053250, filed on Feb. 5, 2015.

(30) Foreign Application Priority Data

Feb. 5, 2014 (JP) .................................. 2014-020423
Feb. 5, 2014 (JP) .................................. 2014-020424

(Continued)

(51) Int. Cl.
*B32B 5/16* (2006.01)
*C01B 21/064* (2006.01)
(Continued)

(52) U.S. Cl.
CPC ............ *C01B 21/0648* (2013.01); *C08K 3/38* (2013.01); *C08L 101/00* (2013.01); *C09K 5/14* (2013.01);
(Continued)

(58) Field of Classification Search
CPC ..... C01B 21/064; C01B 21/0648; C08K 3/38; C09K 5/14; C08L 101/00
See application file for complete search history.

(56) References Cited

U.S. PATENT DOCUMENTS 5,854,155 A 12/1998 Kawasaki et al.
6,096,671 A 8/2000 Kawasaki et al.
(Continued)

FOREIGN PATENT DOCUMENTS

CN 1194960 A 10/1998
EP 2 868 641 A1 5/2015
(Continued)

OTHER PUBLICATIONS

Chinese Office Action dated Mar. 12, 2018 in Chinese Patent Application No. 201580007267.6 (with English translation).
(Continued)

*Primary Examiner* — Shane Fang
(74) *Attorney, Agent, or Firm* — Oblon, McClelland, Maier & Neustadt, L.L.P.

(57) ABSTRACT

The present invention addresses the problem of providing agglomerated boron nitride particles which are suitable to be used as a thermally conductive filler for a heat dissipation sheet of a power semiconductor device, and which exhibit excellent isotropy of thermal conductivity, excellent degra-
(Continued)

dation resistance, and excellent kneadability with respect to resin.

The agglomerated boron nitride particles are obtained by agglomerating boron nitride primary particles. The agglomerated BN articles are characterized in that: a peak area intensity ratio ((100)/(004)) of a (100) plane to a (004) plane of the BN primary particles is 0.25 or more, and the average crystallite size of the BN primary particles obtained from a (002) plane peak of the BN primary particles is 375 Å or more.

12 Claims, 6 Drawing Sheets

(30) Foreign Application Priority Data

| | | |
|---|---|---|
| Oct. 8, 2014 | (JP) | 2014-207522 |
| Dec. 22, 2014 | (JP) | 2014-259221 |
| Jan. 14, 2015 | (JP) | 2015-005424 |
| Jan. 14, 2015 | (JP) | 2015-005428 |

(51) Int. Cl.
*C08L 101/00* (2006.01)
*C08K 3/38* (2006.01)
*C09K 5/14* (2006.01)

(52) U.S. Cl.
CPC ...... *C01P 2002/60* (2013.01); *C01P 2002/72* (2013.01); *C01P 2002/74* (2013.01); *C01P 2004/04* (2013.01); *C01P 2004/32* (2013.01); *C01P 2004/61* (2013.01); *C01P 2006/12* (2013.01); *C01P 2006/32* (2013.01); *C08K 2003/385* (2013.01)

(56) References Cited

U.S. PATENT DOCUMENTS

| | | | |
|---|---|---|---|
| 9,079,801 B2 † | 7/2015 | Lodyga | |
| 2006/0121068 A1 | 6/2006 | Sane et al. | |
| 2006/0127422 A1 † | 6/2006 | Lodyga | |
| 2006/0188727 A1 | 8/2006 | Ito et al. | |
| 2007/0041918 A1 | 2/2007 | Meneghetti et al. | |
| 2007/0241303 A1 † | 10/2007 | Zhong | |
| 2014/0349105 A1 * | 11/2014 | Yamazaki | C08G 59/4042 428/323 |
| 2015/0137026 A1 | 5/2015 | Engler et al. | |
| 2015/0152251 A1 | 6/2015 | Koshida et al. | |
| 2017/0335160 A1 * | 11/2017 | Yamazaki | H01L 27/04 |

FOREIGN PATENT DOCUMENTS

| | | | |
|---|---|---|---|
| JP | 9-202663 | | 8/1997 |
| JP | 10-203807 | | 8/1998 |
| JP | H1160216 | † | 3/1999 |
| JP | 3461651 | † | 10/2003 |
| JP | 2005-232313 | | 9/2005 |
| JP | 2006-257392 | | 9/2006 |
| JP | 2008-510878 | | 4/2008 |
| JP | 2011-6586 | | 1/2011 |
| JP | 2011-144234 A | † | 7/2011 |
| JP | 4817785 B2 | † | 11/2011 |
| JP | 5036696 | † | 9/2012 |
| JP | 2012-224676 A | | 11/2012 |
| JP | 2013-040062 A | † | 2/2013 |
| JP | 2013-147403 A | | 8/2013 |
| JP | 2013-241321 | | 12/2013 |
| JP | WO 2014/003193 A1 | † | 1/2014 |
| JP | 2014040341 | † | 3/2014 |
| WO | WO 03/013845 A1 | † | 2/2003 |
| WO | WO 2006/023860 A2 | | 3/2006 |
| WO | WO 2013/167306 A1 | † | 11/2013 |
| WO | WO 2014/003193 A1 | | 1/2014 |

OTHER PUBLICATIONS

Combined Chinese Office Action and Search Report dated May 10, 2017 in Patent Application No. 201580007267.6 (with English Translation).
Communication pursuant to Rule 114(2) EPC dated Jun. 13, 2017 in European Patent Application No. 15746358.9.
Extended European Search Report dated Jan. 30, 2017 in Patent Application No. 15746358.9.
Anonymous "PolarTherm* Boron Nitride Powder PTX25 and PTX60" Momentive Condensed Product Bulletin, Retrieved from Internet: URL: http://www.momentive.com/WorkArea/DownloadAsset.aspx?id=27497, Retrieved on Sep. 9, 2016, Sep. 1, 2012, 2 Pages.
International Search Report dated Apr. 14, 2015 in PCT/JP2015/053250, filed on Feb. 5, 2015.
English translation of the International Preliminary Report on Patentability and Written Opinion dated Aug. 18, 2016 in PCT/JP2015/053250.
Japanese Office Action dated Aug. 21, 2018, in Japanese Patent Application No. 2015-021255 (with English Translation).
Japanese Office Action dated Aug. 21, 2018, in Japanese Patent Application No. 2015-021224 (with English Translation).
Japanese Office Action dated Aug. 21, 2018, in Japanese Patent Application No. 2015-021240 (with English Translation).
Funahashi et al., Development and Application of High Purity Hexagonal Boron Nitride (h—Bn) Powder, Kawasaki Steel Technical Report, 24 1992, 2, pp. 135-141.†
PolarTherm Boron Nitride Powder, Momentive Performance Materials, Inc., Condensed Product Bulletin, Sep. 2012.†

* cited by examiner
† cited by third party

AGGLOMERATED BORON NITRIDE PARTICLES, PRODUCTION METHOD FOR AGGLOMERATED BORON NITRIDE PARTICLES, RESIN COMPOSITION INCLUDING AGGLOMERATED BORON NITRIDE PARTICLES, MOULDED BODY, AND SHEET

CROSS-REFERENCE TO RELATED APPLICATION

This is a continuation of International Application PCT/JP2015/053250, filed on Feb. 5, 2015, and designated the U.S., (and claims priority from Japanese Patent Application 2014-020424 which was filed on Feb. 5, 2014, Japanese Patent Application 2014-020423 which was filed on Feb. 5, 2014, Japanese Patent Application 2014-207522 which was filed on Oct. 8, 2014, Japanese Patent Application 2014-259221 which was filed on Dec. 22, 2014, Japanese Patent Application 2015-005424 which was filed on Jan. 14, 2015, and Japanese Patent Application 2015-005428 which was filed on Jan. 14, 2015,) the entire contents of which are incorporated herein by reference.

TECHNICAL FIELD

The present invention accords to agglomerated boron nitride particles (hereinafter referred to as "agglomerated BN particles") and a production method of the particles, and in particular, relates to agglomerated BN particles constituted by boron nitride primary particles (hereinafter referred to as "BN primary particles"), and a production method thereof.

The present invention also relates to a resin composition including agglomerated BN particles, which includes these agglomerated BN particles and a moulded body obtained by moulding this resin composition including agglomerated BN particles.

The present invention also relates to a sheet including specific BN primary particles in a specific state.

BACKGROUND ART

Summary of the Related Art

Boron nitride (hereinafter referred to as "BN") is a insulating ceramic, various crystalline types of which are known such as c-BN having a diamond structure, h-BN having a graphite structure, α-BN and β-BN having a disordered layer structure, and so on.

Among them, h-BN, which has the same stratified structure as that of graphite, is widely used in the field of electrical and electronic materials, because it is relatively easily synthesized and excellent in thermal conductivity, solid lubricity, chemical stability, and thermal resistance.

In recent years, and particularly in electrical and electronic fields, heat generation associated with high density of integrated circuits has become significantly problematic, and how to dissipate the heat has become an urgent subject. The h-BN has a high thermal conductivity in spite of its insulating property and attracts interest as thermally conductive filler for such a heat dissipation products in order to take advantage of the property.

However, the h-BN, which has a plate-like particle-shape, exhibits only a low thermal conductivity (usually thermal conductivity of about 2-3 W/mK) in the thickness direction of the plate (direction of C-axis) although it exhibits a high thermal conductivity (usually thermal conductivity of about 400 W/mK) in the surface direction of the plate (ab plane, or (002) plane), and when it is blended with resin to prepare a resin including BN particles to mould the composition into, for example, a plate-like moulded body, it causes a problem that the plate-like h-BN is oriented, during the formation, in the surface direction of the plate which is a flow direction of the resin composition including BN particles, and a resultant moulded body exhibits a low thermal conductivity in the thickness direction of the plate although it is excellent in thermal conductivity in the surface direction.

For this reason, in order to improve such an anisotropy of the thermal conductivity of the h-BN, an agglomerated particle constituted by h-BN primary particles has been examined, which exhibits a low degree of the above orientation and has a non-scale-like shape even when moulded into a moulded body. Examples of such agglomerated h-BN particles include an agglomerated h-BN particle granulated by, for example, spray-dry, and an agglomerated h-BN particle produced by trituration of a sintered product obtained by sintering h-BN (Patent documents 1 and 2). A pinecone-like agglomerated h-BN particle has been proposed which is an agglomerated h-BN particle produced from a mixture of boric acid and melamine, with primary particles agglomerated without any orientation (Patent document 3).

In other words, in conventional agglomerated h-BN particles, it has been examined to reduce contact resistance between agglomerated particles by fabricating a large agglomerated particle. In addition, in order to achieve high thermal conductivity by reducing grain boundary between h-BN primary particles constituting the agglomerated h-BN particle, h-BN primary particles have been used which have a relatively large particle diameter of from about a few μm to about a few hundred μm and high crystallinity (Patent documents 1, 2, and 3).

Although heat dissipation sheets as use applications of such conventional agglomerated BN particles are known which are required, for example, in power semiconductor devices, they must be moulded, in order to reduce contact resistance between agglomerated BN particles, under a constant pressure, which degrades agglomerated BN particles and makes primary particles be oriented in a direction of the moulded surface, resulting in low thermal conductivity in the direction perpendicular to the moulded surface, and the conductivity so far has not yet reached its practical level. Thus, it is demanded to develop agglomerated BN particles which can provide high thermal conductivity in a direction perpendicular to heat dissipation sheet even under a constant pressure, and moreover, it is demanded to develop agglomerated BN particles which, in itself, have a high thermal conductivity.

Patent document 4 describes agglomerated boron nitride particles which have a specific surface area of 10 $m^2/g$ or more, a total pore volume of 2.15 $cm^3/g$ or less, and a surface constituted by boron nitride primary particles having an average particle diameter of 0.05 μm or more and 1 μm or less, and the document discloses agglomerated h-BN particles having a card-house structure. Although the agglomerated boron nitride particles described in Patent document 4 improve degradation resistance, they have a small diameter and are required to be relatively improved in thermal conductivity and voltage resistance.

Except for such improvement in the performance of agglomerated BN particles in the particle state, Patent document 5, for example, discloses a composition including inorganic filler which is constituted by larger secondary agglomerates and smaller secondary agglomerates as a result of including, in a specific ratio, two kinds of secondary agglomerates different in average major axis of their primary particles. Patent document 6 discloses a composition of flattened filler and particulate filler. However, in Patent documents 5 and 6, the strength of the particles itself is not sufficient, and thermal conductivity and voltage resistance have not yet reached their practical levels so far.

Heat dissipation sheets as use applications of such conventional agglomerated BN particles are widely known which are required, for example, in power semiconductor devices, to which is applied a composition including agglomerated BN particles or a moulded body obtained by using the composition. In the above-mentioned use applications, the composition or the moulded body is required to have a high thermal conductivity and a high voltage resistant performance. In order to achieve these performances, it is required to reduce voids between agglomerated BN particles and contact resistance. However, in order to reduce the contact resistance between agglomerated BN particles, they must be moulded under a constant pressure, which degrades the agglomerated BN particles and leads to the orientation of primary particles in a direction of the moulded surface, resulting in a low thermal conductivity in the direction perpendicular to the moulded surface, and the conductivity has not yet reached its practical level so far. Thus, agglomerated BN particles are demanded which can provide high thermal conductivity in a direction perpendicular to the heat dissipation sheet even under a constant pressure, and moreover, it is demanded to develop agglomerated BN particles which, in itself, have high thermal conductivity.

PRIOR ART

Patent Documents

Patent document 1: JP-A-2006-257392
Patent document 2: JP-T-2008-510878
Patent document 3: JP-A-9-202663
Patent document 4: JP-A-2013-241321
Patent document 5: JP-A-2011-6586
Patent document 6: JP-A-2005-232313

DISCLOSURE OF THE INVENTION

Problems to be Solved by the Invention

Examinations by the present inventors have revealed that, in conventional agglomerated BN particles, low crystallinity of primary particles and the boundary between primary particles constituting agglomerated BN particles are one of the reasons of deterioration of the thermal conductivity of the agglomerated BN particles. In other words, these reasons are attributed to phonon, which is a carrier of thermal conductivity, scattered in the boundary of the primary particles and the grain boundary therein.

It has been also revealed that contact resistance between agglomerated particles due to larger agglomerated BN particles can be reduced to some extent also when resin is filled with conventional agglomerated BN particles, but that the orientation of BN primary particles constituting the agglomerated BN particles increases the contact resistance between the agglomerated BN particles, resulting in deterioration of thermal conductivity. In other words, in order to improve thermal conductivity in a moulded body, it was assumed to be effective not only to control the orientation of BN primary particles constituting agglomerated BN particles to reduce the contact resistance between the agglomerated BN particles, but also to increase the crystallinity of the BN primary particles constituting the agglomerated BN particles, and in addition, to reduce grain boundary in the BN primary particles constituting the agglomerated BN particles.

A subject of the present invention is to solve the above-mentioned conventional problems, to produce agglomerated BN particles constituted by BN primary particles having a high thermal conductivity, with reduced contact resistance between the agglomerated BN particles, and to provide agglomerated BN particles excellent in applicability to various moulded bodies and a production method thereof. Another subject of the present invention is to provide a resin composition including agglomerated BN particles which includes these agglomerated BN particles and resin, and a moulded body moulded from this resin composition including agglomerated BN particles.

Still another subject of the present invention is to provide, by advancing the above-mentioned findings, a sheet having high thermal conductivity and high voltage resistance.

Means for Solving the Problems

Intensive examinations by the present inventors have revealed that a specific range of the viscosity of raw material slurry during fabrication of agglomerated BN particles increases the average crystallite size of BN primary particles constituting the agglomerated BN particles. The increase in the average crystallite size reduces the grain boundary between crystallites in the primary particles, resulting in successful improvement in the thermal conductivity of the agglomerated BN particles. Further, it has been unexpectedly found that because the agglomerated BN particles fabricated in such a way have an oriented specific crystal plane of the BN primary particles constituting the agglomerated BN particles, a moulded body having a higher thermal conductivity in comparison to conventional agglomerated BN particles can be fabricated when moulded by using the present agglomerated BN particles, and thus the present invention has been completed.

In other words, the first summaries of the present invention are from (a-1) to (a-13) below.

(a-1) A agglomerated boron nitride particle (hereinafter referred to as "agglomerated BN particle") constituted by boron nitride primary particles (hereinafter referred to as "BN primary particles"), wherein a peak area intensity ratio ((100)/(004)) of a (100) plane to a (004) plane of the BN primary particles is 0.25 or more, the peak intensity ratio being obtained by subjecting, to a powder X-ray diffraction measurement, a pellet-shaped sample moulded at a moulding pressure of 0.85 ton/cm$^2$ using a 10 mmφ powder pellet moulding machine, and an average crystallite size of the BN primary particles obtained from a (002) plane peak of the BN primary particles is 375 Å or more, the average crystallite size being obtained as a result of filling a glass sample plate having a depth of 0.2 mm with the agglomerated BN particles in such a way that the sample surface becomes smooth, and subjecting the agglomerated BN particles to a powder X-ray diffraction measurement.

(a-2) The agglomerated BN particle according to (a-1), wherein an average particle diameter $D_{50}$ of the agglomerated BN particle is 26 μm or more.

(a-3) The agglomerated BN particle according to (a-1) or (a-2), wherein a specific surface area of the agglomerated BN particle is 8 m$^2$/g or less.

(a-4) The agglomerated BN particle according to any one of (a-1) to (a-3), wherein the agglomerated BN particle is spherical.

(a-5) The agglomerated BN particle according to any one of (a-1) to (a-4), wherein the agglomerated BN particle has a card-house structure.

(a-6) A composition of the agglomerated BN particles which is a mixture of the agglomerated BN particles according to any one of (a-1) to (a-5) and filler.

(a-7) A resin composition including agglomerated BN particles, including resin and the agglomerated BN particles according to any one of (a-1) to (a-5).

(a-8) A moulded body including the agglomerated BN particles according to any one of (a-1) to (a-5).

(a-9) A method of producing agglomerated BN particles, including the steps of:

granulating slurry of raw material boron nitride powder (hereinafter referred to as "BN slurry"); and performing heating treatment, wherein in the granulating step, a viscosity of the BN slurry is 200 mPa·s or more and 5000 mPa·s or less, and in the heating step, the heat treatment is performed at 1800° C. or more and 2300° C. or less.

(a-10) The method of producing the agglomerated BN particles according to (a-9), wherein an oxygen concentration of the raw material boron nitride powder is 1% by mass or more and 10% by mass or less.

(a-11) An agglomerated BN particle obtained by the production method according to (a-9) or (a-10).

(a-12) A sheet including agglomerated boron nitride particles (hereinafter referred to as "agglomerated BN particles"), wherein a peak intensity ratio ((100)/(004)) of a (100) plane to a (004) plane of boron nitride primary particles (hereinafter referred to as "BN primary particles") in the sheet is 1.0 or more, the peak intensity ratio being obtained by subjecting the sheet to a powder X-ray diffraction measurement, and an average crystallite size of the BN primary particles obtained from a (002) plane peak of the BN primary particles in the sheet is 375 Å or more, the average crystallite size being obtained by subjecting the sheet to a powder X-ray diffraction measurement.

(a-13) The sheet according to (a-12), wherein the peak area intensity ratio ((100)/(004)) of the (100) plane to the (004) plane of the boron nitride primary particles (hereinafter referred to as "BN primary particles") in the sheet is 0.6 or more, the peak area intensity ratio being obtained by subjecting the sheet to an X-ray diffraction measurement.

The second summaries of the present invention are from (b-1) to (b-10).

(b-1) A composition including agglomerated boron nitride particles, including agglomerated boron nitride particles (A) constituted by agglomerated boron nitride primary particles and inorganic particles (B), wherein at least the agglomerated boron nitride particles (A) have a card-house structure, and a volume average particle diameter ($D_{50}$) of the agglomerated boron nitride particles (A) is 25 μm or more, and a relation, volume average particle diameter ($D_{50}$) of agglomerated boron nitride particles (A)>volume average particle diameter ($D_{50}$) of inorganic particles (B), is satisfied.

The composition exhibits high thermal conductivity because the agglomerated boron nitride particles (A) have a card-house structure, and the volume average particle diameters ($D_{50}$) of the agglomerated boron nitride particles (A) and the inorganic particles satisfy the above described relation, enabling reduction of phonon scattering arising in the grain boundary of the BN primary particles constituting the agglomerated BN particles.

(b-2) A composition including agglomerated boron nitride particles, including agglomerated boron nitride particles (A) constituted by boron nitride primary particles and inorganic particles (B), wherein the peak intensity ratio ((100)/(004)) of the (100) plane to the (004) plane of the boron nitride primary particles is 3 or more, the peak intensity ratio being obtained by subjecting the agglomerated boron nitride particles (A) to a powder X-ray diffraction measurement, and the average crystallite size of the boron nitride primary particles obtained from the (002) plane peak of the boron nitride primary particles is 375 Å or more.

The composition keeps the orientation of specific crystal plane of the BN primary particles, in other words, it keeps the peak intensity ratio ((100)/(004)) of the (100) plane to the (004) plane by a powder X-ray diffraction measurement to be 3 or more and has a large average crystallite size, leading to not only high thermal conductivity as agglomerated particles, but also high thermal conductivity even as a moulded body composited with resin.

(b-3) The composition including agglomerated boron nitride particles according to (b-2), wherein the volume average particle diameter ($D_{50}$) of the agglomerated boron nitride particles (A) is 25 μm or more, and a relation, volume average particle diameter ($D_{50}$) of agglomerated boron nitride particles (A)>volume average particle diameter ($D_{50}$) of inorganic particle (B), is satisfied.

(b-4) The composition including agglomerated boron nitride particles according to any one of (b-1) to (b-3), wherein the agglomerated boron nitride particles (A) and the inorganic particles (B) are spherical.

(b-5) The composition including agglomerated boron nitride particles according to any one of (b-1) to (b-4), wherein a content proportion of the agglomerated boron nitride particles (A) is 30-95% by mass with respect to the agglomerated boron nitride particles (A) and the inorganic particles (B) in total.

(b-6) The composition including agglomerated boron nitride particles according to any one of (b-1) to (b-5), wherein the inorganic particle (B) is one or more selected from boron nitride, aluminum nitride, alumina, zinc oxide, magnesium oxide, beryllium oxide, and titanium oxide.

(b-7) A coating liquid including the composition including agglomerated boron nitride particles according to any one of (b-1) to (b-6).

(b-8) A moulded body obtained by moulding the composition including agglomerated boron nitride particles according to any one of (b-1) to (b-6).

(b-9) A sheet including the agglomerated boron nitride particles (A), wherein the peak intensity ratio ((100)/(004)) of the (100) plane to the (004) plane of the boron nitride primary particles is 1.0 or more, and/or the peak area intensity ratio ((100)/(004)) is 0.6 or more, the ratios being obtained by subjecting the sheet to an X-ray diffraction measurement.

(b-10) A sheet, wherein the average crystallite size of the agglomerated boron nitride particles obtained from the (002) plane peak of the BN primary particles in the sheet is 300 Å or more, the peak being obtained by subjecting the sheet to an X-ray diffraction measurement.

Effect of the Invention

The agglomerated BN particles of the present invention not only have an oriented specific crystal plane of the BN primary particles constituting the agglomerated BN particles because the peak intensity ratio ((100)/(004)) of (100) plane to (004) plane of the BN primary particles constituting the agglomerated BN particles is 3 or more, the peak intensity ratio being obtained from a powder X-ray diffraction measurement, but also can reduce phonon scattering generated on the grain boundary of the BN primary particles constituting the agglomerated BN particles because the average crystallite size of the BN primary particles obtained from the (002) plane peak of the BN primary particles by subjecting the agglomerated BN particles to a powder X-ray diffraction measurement is 375 Å or more, and as a result, exhibit a high thermal conductivity. In addition, since the BN primary particles have a peak area intensity ratio ((100)/(004)) of (100) plane to (004) plane of 0.25 or more even when moulded in a certain range of pressure, a moulded body obtained by moulding the resin composition including the agglomerated BN particles of the present invention keeps the orientation of a specific crystal plane of the BN primary particles constituting the agglomerated BN particles even after the moulding. Therefore, the moulded body exhibits high thermal conductivity in a direction perpendicular to the moulded surface (thickness direction of the moulded body) and is very useful for preferably heat dissipation sheets required in, for example, power semiconductor devices.

EMBODIMENT FOR CARRYING OUT THE INVENTION

Although embodiments of the present invention will be specifically explained hereinafter, the present invention is not limited to the following embodiments and various modifications can be practiced within the scope of the spirit of the present invention.

[Agglomerated BN Particle]

An agglomerated BN particle of the present invention, constituted by BN primary particles, may include components other than the above-mentioned BN primary particles within a range not to impair the effect of the present invention. Examples of the components other than the BN primary particles include a component originated from a binder, a surfactant, and a solvent, which are able to be added to slurry, and will be described in [Method of producing agglomerated BN particle] below.

Figure 1:
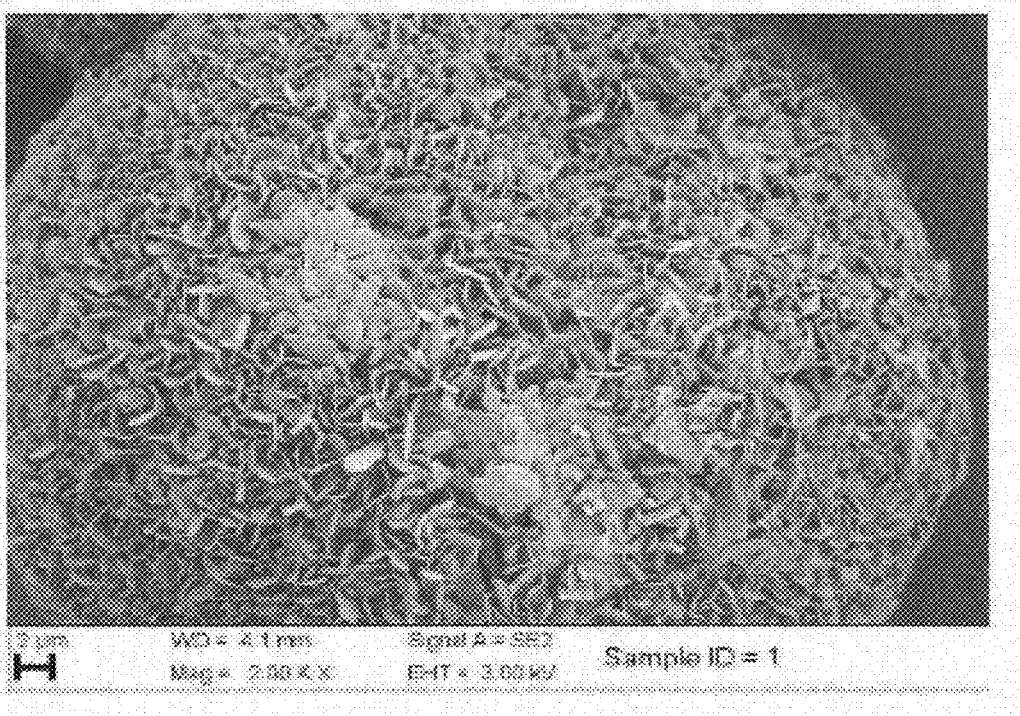
FIG. 1 is a scanning electron microscopic (hereinafter referred to as "SEM") photograph of the agglomerated BN particles of the present invention at 200,000× magnification.
Figure 2:
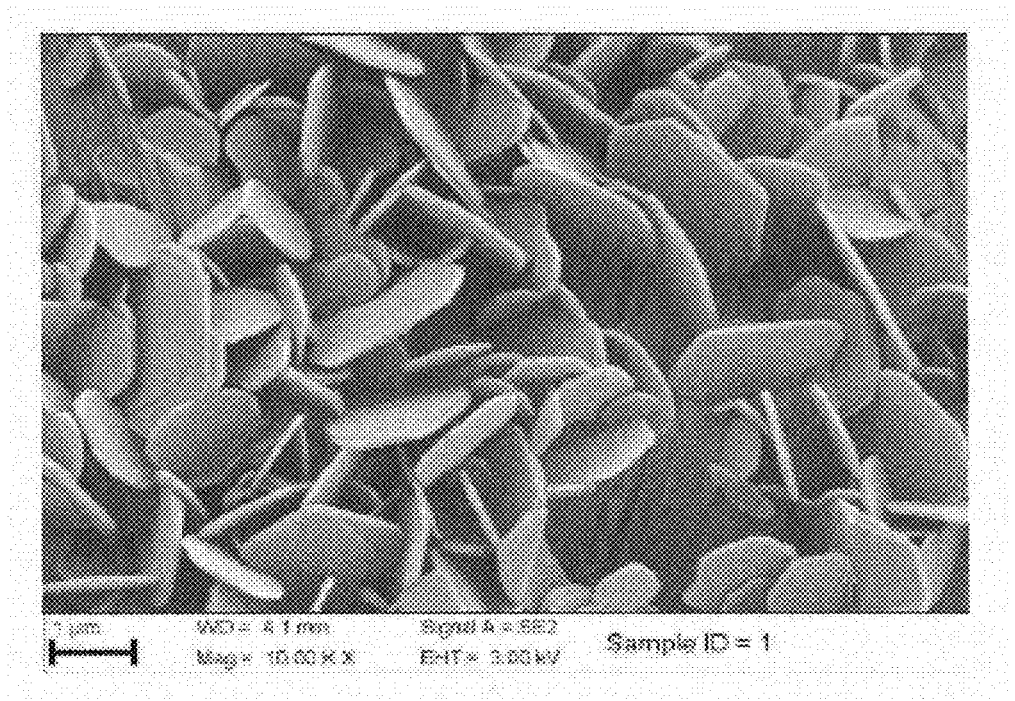
FIG. 2 is a SEM photograph of the agglomerated BN particles of the present invention at 1,000,000× magnification.

The form of the agglomerated BN particle of the present invention is not particularly limited, but is preferably characterized in a spherical shape such as that depicted in FIG. 1, and the from of the agglomerated BN particle can be confirmed by SEM.

The term "spherical" means that the aspect ratio (ratio of the major axis to the minor axis) of the agglomerated BN particle is 1 or more and 2 or less, and preferably 1 or more and 1.5 or less. The aspect ratio is determined by calculating an average value of ratios of the major axis to the minor axis obtained from more than 200 particles arbitrarily selected from a SEM image.

Figure 3:
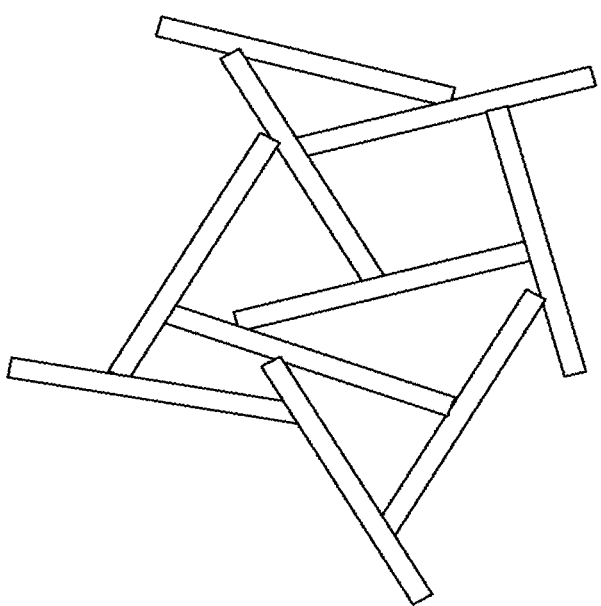
FIG. 3 is an exemplary diagram of a card-house structure.

In addition, the agglomerated BN particle is preferably in a form like a sea hedgehog in which the crystals of BN primary particles on the agglomerated BN particle surface grow radially from the center side of the agglomerated BN particle toward the surface side thereof, or a sea hedgehog in which BN primary particles which are small plates are sintered and agglomerated spherically. Further, the agglomerated BN particle preferably has a card-house structure. The card-house structure, which is described, for example, in "Ceramics 43 No. 2 (2008, published by The Ceramic Society of Japan)", is a structure formed by plate-like particles stacked intricately without orientation. More specifically, the agglomerated BN particle having a card-house structure is an assembly of BN primary particles, which is a agglomerated BN particle having a structure in which the planar portion of each of the primary particle is in contact to the end surface portion of others (See FIG. 3), and the agglomerated BN particle is preferably spherical. Further, the card-house structure is preferably a similar structure even inside the particles. These agglomerated forms and the internal structure of the agglomerated BN particle can be confirmed by Scanning Electron Microscopy (SEM).

The agglomerated BN particle of the present invention includes BN primary particles which constitute the agglomerated BN particle and have specific physical properties, which will be specifically described below. Samples (powder) subjected to measurements for the physical properties specified herein may be either agglomerated BN particle powder before moulded into a moulded body, or a moulded body including the agglomerated BN particles or agglomerated BN particle powder extracted from the moulded body. Preferably, it is agglomerated BN particle powder before moulded into a moulded body.

(Properties of Agglomerated BN Particle)

Size of Primary Particle

The major axis of the BN primary particle constituting the agglomerated BN particle is usually 0.5 μm or more, preferably 0.6 μm or more, more preferably 0.8 μm or more, still more preferably 1.0 μm or more, and particularly preferably 1.1 μm or more. It is usually 10 μm or less, preferably 5 μm or less, more preferably 3 μm or less.

The above-mentioned major axis is an averaged value of maximum lengths for respective observable BN primary particles constituting a single agglomerated BN particle which is magnified on an image obtained by SEM measurement.

Crystal Structure of BN Primary Particles Constituting Agglomerated BN Particle

The crystal structure of the BN primary particle is not particularly limited, but the particle preferably includes h-BN as a main component, which is a hexagonal system, from the viewpoint of easiness of synthesis and thermal conductivity. When an inorganic component as a binder is included other than BN, it crystallizes during thermal treatment, but BN only has to be included as a main component. The crystal structure of the above-mentioned BN primary particle can be confirmed by a powder X-ray diffraction measurement.

Average Crystallite Size of BN Primary Particles

The average crystallite size of BN primary particles obtained from the (002) plane peak of the BN primary particles obtained by subjecting agglomerated BN particles to a powder X-ray diffraction measurement is not particularly limited, but is preferably large from the viewpoint of thermal conductivity. For example, it is usually 300 Å or more, preferably 320 Å or more, more preferably 375 Å or more, still more preferably 380 Å or more, still more preferably 390 Å or more, and particularly preferably 400 Å or more, and usually 5,000 Å or less, preferably 2,000 Å or less, more preferably 1,000 Å or less. If the average crystallite size is too large, BN primary particles overgrow, and therefore, voids between agglomerated BN particles increase, worsening formability during the formation of a moulded body and resulting in tendency not to improve thermal conductivity. If the average crystallite diameter is too small, grain boundaries in the BN primary particles increase, generating phonon scattering on the grain boundary and resulting in tendency to lower thermal conductivity.

The powder X-ray diffraction measurement is carried out by filling a glass sample plate having a depth of 0.2 mm with agglomerated BN particles in such a way that the sample surface becomes smooth.

The term "average crystallite size" herein is a crystallite size calculated based on the Scherrer formula, as described later in Examples, from the (002) plane peak of the BN primary particles obtained by the powder X-ray diffraction measurement.

Peak Intensity Ratio of BN Primary Particles

The peak intensity ratio ((100)/(004)) of the (100) plane to the (004) plane of the BN primary particles is 3 or more, the peak intensity ratio being obtained as a result of filling a glass sample plate having a depth of 0.2 mm with agglomerated BN particle powder before moulded into a moulded body such as sheet, in such a way that the sample surface becomes smooth, and subjecting the sample to the powder X-ray diffraction measurement.

The peak intensity ratio of the (100) plane to the (004) plane of the agglomerated BN particles is usually 3 or more, preferably 3.2 or more, more preferably 3.4 or more, still preferably 3.5 or more, and usually 10 or less, preferably 8 or less, still preferably 7 or less. If the ratio is greater than the upper limit, the particles tend to degrade when moulded into a moulded body, and if it is lower than the lower limit, thermal conductivity in the thickness direction tends not to be improved.

The peak intensity ratio can be calculated from the ratio of the corresponding peak intensities measured by the powder X-ray diffraction measurement.

Peak Area Intensity Ratio of BN Primary Particles

Another expression can be also possible in which the peak area intensity ratio ((100)/(004)) of the (100) plane to the (004) plane of the BN primary particles is 0.25 or more, the peak area intensity ratio being obtained by subjecting, to the powder X-ray diffraction measurement, a pellet-shaped sample of the agglomerated BN particles moulded at a moulding pressure of 0.85 ton/cm² using a 10 mmφ powder pellet moulding machine. This peak area intensity ratio ((100)/(004)) is preferably 0.3 or more, preferably 0.5 or more, more preferably 0.7 or more, still preferably 0.81 or more, particularly preferably 0.85 or more, especially preferably 0.91 or more. The upper limit is not particularly limited, but it is usually 10.0 or less, preferably 5.0 or less, more preferably 4.0 or less, and still preferably 2.0 or less, and particularly preferably 1.6 or less.

Still another expression is that the peak area intensity ratio ((100)/(004)) of the (100) plane to the (004) plane of the BN primary particles constituting the agglomerated BN particle is usually 0.25 or more, preferably 0.30 or more, more preferably 0.35 or more, still preferably 0.40 or more, and usually 2.0 or less, preferably 1.5 or less, still preferably 1.2 or less, the peak area intensity ratio being obtained by subjecting, to the powder X-ray diffraction measurement, a pellet-shaped sample of agglomerated BN particles moulded at a moulding pressure of 0.85 ton/cm² or more and 2.54 ton/cm² or less using a 10 mmφ powder pellet moulding machine. If the ratio is too large, the agglomerated BN particles tend to exhibit large contact resistance therebetween when moulded into a moulded body, and is too small, the agglomerated BN particles tend to degrade, and thermal conductivity in the thickness direction tends not to be improved.

Optimum press pressure conditions, for example, in heat dissipation sheets usually differ depending on the kind of the heat dissipation sheets. Agglomerated BN particles dispersed in a resin matrix is subjected to a pressure condition according to a use application, but the BN particles usually tend to have an ab plane oriented in a direction perpendicular to the pressure direction. Even in the case that agglomerated BN particles are used, particle distortion occurs due to the moulding pressure, and as a result, the ab plane tends to be oriented in a direction perpendicular to the pressure direction.

For example, highly heat-dissipating substrates made of resin are thought to be moulded at a relatively high pressure of 0.85 ton/cm² or more and 2.54 ton/cm² or less for the purpose of perfect contact between dispersed agglomerated BN particles and reduction of voids inside the resin substrate. For this reason, agglomerated BN particles with small variation of the orientation of BN primary particles even in the above-mentioned pressure range are necessary for improvement in thermal conductivity.

In the present invention, agglomerated BN particles having physical properties specified herein, preferably BN primary particles constituting agglomerated BN particles have a card-house structure, in other words, a structure mutually reinforced by the contact of the planar portion of each BN primary particle to the end surface portion of others, enabling controlling the distortion of the agglomerated BN particles in a wide range of moulding pressure. Optimum pressure ranges differ depending on use applications, but in order to achieve high thermal conductivity in the thickness direction of a moulded body, it is preferable to achieve a state which keeps the orientation of the primary particles to at least a certain extent in the range of 0.85 ton/cm² or more and 2.54 ton/cm².

The orientation of primary particles to at least a certain extent is represented, for example, by the peak area intensity ratio ((100)/(004)) of the (100) plane to the (004) plane of the primary particles, and the ratio represents how small is the proportion of the ab plane oriented in the (004) plane, in other words, in a direction perpendicular to the pressure direction. Therefore, the larger the above-mentioned peak area intensity ratio is, the smaller the distortion of the agglomerated BN particles due to moulding pressure is. In order to achieve high thermal conductivity, it is thought that at least the peak area intensity ratio must be 0.25 or more. The lower and upper limits of the peak area intensity ratio are as described above.

The peak area intensity ratio in the range of 0.85 ton/cm² or more and 2.54 ton/cm² only has to achieve the given value at least one pressure point within the above-mentioned pressure range, and not has to achieve the value in the whole range of the pressure of the present invention. It preferably achieves the value at three points which are 0.85 ton/cm², 1.69 ton/cm², and 2.54 ton/cm².

For the above-mentioned peak area intensity ratio, the measurement uses samples obtained as a result of filling a powder pellet moulding machine (10 mmφ) with 0.2 g of the powder and then moulding the powder into a pellet by using a hydraulic hand pump (P-1B-041 from RIKEN SEIKI CO., LTD) at various press pressures (for example, 0.85 ton/cm², 1.69 ton/cm², 2.54 ton/cm²). The measurement can be performed by using X'Pert Pro MPD powder X-ray diffractometer of PANalytical B.V. in the Netherlands to calculate corresponding peak area intensity ratios.

Average Particle Diameter ($D_{50}$) of Agglomerated BN Particle

The average particles diameter ($D_{50}$) of the agglomerated BN particle is usually 5 μm or more, and preferably 10 μm or more, more preferably 25 μm or more, still more preferably 26 μm or more, particularly preferably 30 μm or more, most preferably 40 μm or more, even preferably 45 μm or more, and even preferably 50 μm or more. It is usually 200 μm or less, preferably 150 μm or less, more preferably 100 μm or less. If it is too large, the smoothness of the surface of the particle is deteriorated after they are moulded into a moulded body, and voids between the agglomerated BN particles increase, resulting in tendency not to improve thermal conductivity, and if it is too small, the contact resistance between the agglomerated BN particles tends to increase after they are moulded into a moulded body, and thermal conductivity of the agglomerated BN particles itself tends to decrease.

$D_{50}$ means a particle diameter at a point of just 50% of accumulated volume on an accumulation curve with respect to the volume of powder subjected to measurement to be 100%, and examples of the measurement methods include a wet measurement method which can be carried out, by using an apparatus measuring grain size distribution based on laser diffraction/scattering, for a sample of agglomerated BN particles dispersed in pure water medium including sodium hexamethaphosphate as a dispersion stabilizer, and a dry measurement method which can be carried out by using "Morphologi" from Malvern Instruments Ltd.

Breaking Strength

Breaking strength of the agglomerated BN particles is usually 2.5 MPa or more, preferably 3.0 MPa or more, more preferably 3.5 MPa or more, still more preferably 4.0 MPa or more, and is usually 20 MPa or less, preferably 15 MPa or less, more preferably 10 MPa or less. If it is too large, robustness of the particles is too strong, worsening the surface smoothness after they are moulded into a moulded body, and therefore, thermal conductivity tends to decrease, and if it is too small, the deformation of the particles is likely to occur due to the pressure during fabrication of the moulded body, and therefore, thermal conductivity tends not to improve.

The breaking strength can be derived, by using the following formula, from a result obtained by a compression test of a single particle according to JIS R 1639-5. The particle is usually subjected to the measurement five times, and the average value of the results from the measurements is adopted.

$$Cs = 2.48 P/\pi d^2 \quad \text{Formula:}$$

Cs: breaking strength (MPa)
P: breaking test force (N)
d: particle diameter (mm)

Total Pore Volume

The total pore volume of the agglomerated BN particle is usually 2.2 cm³/g or less. The agglomerated BN particle with small total pore volume has a densely packed internal region, enabling reducing grain boundaries which inhibit thermal conductivity, and as a result, the agglomerated BN particle has higher thermal conductivity. If the agglomerated BN particle has too large total pore volume, resin may be captured in the pores when the particle is used as filler in a composition, and as a result, apparent viscosity may increase, and moulding of the composition or application of a coating liquid may be difficult.

The lower limit of the total pore volume of the agglomerated BN particle is not particularly limited, but it is usually 0.01 cm³/g. The total pore volume in the present invention is preferably 0.01 cm³/g or more, more preferably 0.02 cm³/g or more, and preferably 2 cm³/g or less, more preferably 1.5 cm³/g or less.

The total pore volume of agglomerated BN powder can be measured by the nitrogen adsorption method and the mercury intrusion method.

Specific Surface Area

The specific surface area of the agglomerated BN particle is usually 1 m²/g or more, and it is preferably 3 m²/g or more and 50 m²/g or less, more preferably 5 m²/g or more and 40 m²/g or less. In addition, it is preferably 8 m²/g or less, and also preferably 7.25 m²/g or less. The specific surface area of the agglomerated BN particle within this range is preferable because contact resistance between the agglomerated BN particles tends to reduce when the particles are composited with resin, and increase in viscosity of resin composition including agglomerated BN particles can be also suppressed. The specific surface area can be measured by the single point BET method (absorption gas: nitrogen).

Bulk Density

When the agglomerated BN particles are used as filler, the bulk density of the agglomerated BN particles desirably large in order to minimize capture of resin, and usually it is preferably 0.3 g/cm³ or more, more preferably 0.35 g/cm³ or more, still more preferably 0.4 g/cm³ or more. If the bulk density of the agglomerated BN particles is too small, the apparent volume becomes large, and not only the volume of the added agglomerated BN particles increases in comparison to the resin in the resin composition including agglomerated BN particles, but also the capture of the resin is enhanced, and moreover, easiness to handle the agglomerated BN particles tends to significantly worsen. The upper limit of the bulk density of the agglomerated BN particles is not particularly limited, but it is usually 0.95 g/cm³ or less, preferably 0.9 g/cm³ or less, more preferably 0.85 g/cm³ or less. If the bulk density of the agglomerated BN particles is too large, the agglomerated BN particles disperse non-uniformly in the resin composition including agglomerated BN particles, and tend to settle.

The bulk density of the agglomerated BN particles can be obtained by using usual apparatuses and methods for measuring the bulk density of powder.

[Method of Producing Agglomerated BN Particle]

The agglomerated BN particles of the present invention can be produced by granulating particles using slurry including raw material BN powder preferably having a viscosity of 200-5000 mPa·s (hereinafter also referred to as "BN slurry"), and then carrying out heating treatment of the granulated particles, to grow crystallites of the BN primary particles constituting agglomerated BN particles, with the size of the granulated particles kept as is. The viscosity of the BN slurry is preferably 300 mPa·s or more, more preferably 500 mPa·s or more, still more preferably 700 mPa·s or more, particularly preferably 1000 mPa·s or more, and preferably 4000 mPa·s or less, more preferably 3000 mPa·s or less.

The viscosity of the above-mentioned BN slurry strongly affect the average particle diameter $D_{50}$ by volume of the produced agglomerated BN particles and the average crystallite size of the BN primary particles constituting the agglomerated BN particles, and therefore, the average crystallite size of BN primary particles and the average particle diameter $D_{50}$ based on volume of agglomerated BN particles can be made large by adjusting the viscosity to 200 mPa·s or more.

On the other hand, granulation can be facilitated by adjusting the viscosity of BN slurry to 5000 mPa·s or less. A preparation method of the viscosity of the BN slurry will be described later.

The viscosity of the BN slurry in the present invention means a viscosity measured by using a rotatory viscometer "VISCO BASIC Plus R" from FUNGILAB at a blade-rotation speed of 100 rpm.

Further, when a resin composition including agglomerated BN particles is fabricated by using the agglomerated BN particles of the present invention as filler, the thermal conductivity of an obtained moulded body can be dramatically improved in comparison to other BN particles even in the same filling quantity. This is attributed to the fact that in the agglomerated BN particles of the present invention, increase in the average crystallite size of the BN primary particles constituting agglomerated BN particles leads to decrease in the grain boundary in the BN primary particles, and the specific surface of the BN primary particles constituting agglomerated BN particles is oriented, and also thought to be affected by the fact that largeness of the average particle diameter $D_{50}$ by volume of the agglomerate particles preferably leads to decrease the contact resistance between the agglomerated BN particles.

Not only the agglomerated BN particles of the present invention themselves have high thermal conductivity, but also a moulded body fabricated by compositing them with resin has high thermal conductivity.

In other words, according to the invention of the present application, a method has been found which can increase the average crystallite size of BN primary particles constituting agglomerated BN particles by controlling, within a specific range, the slurry viscosity which those skilled in the art usually have not assumed to control.

In addition, according to the present invention, a method has been found which produces the agglomerated BN particles specified herein by controlling the above-mentioned slurry viscosity within a specific range.

The above-mentioned peak intensity ratio and the crystallite size can be controlled by sintering temperature during a heating treatment for producing granulated particles from the BN slurry and the concentration of oxygen present in raw material BN powder. Specifically, as will be described later, by controlling the sintering temperature range during the heating treatment for producing granulated particles from the BN slurry to be 1800° C. or more and 2300° C. or less, the peak intensity ratio can be 3 or more, and by using a raw material in which the oxygen concentration in the raw material BN powder is 1.0% by weight or more, the crystallite size can be controlled within a desirable range. In other words, by using a proper range of sintering temperature and raw material BN powder of a proper oxygen concentration, the above-mentioned peak intensity ratio and the above-mentioned average crystallite size can be controlled simultaneously.

Thus, contact resistance between the agglomerated BN particles is reduced and grain boundary of the BN primary particles constituting agglomerated BN particles decreases when a resin composition including agglomerated BN particles are produced from the agglomerated BN particles, and therefore, the agglomerated BN particles with high thermal conductivity can be fabricated which has an oriented specific crystal plane of the BN primary particles constituting the agglomerated BN particles.

As the agglomerated BN particles obtained according to the present invention can be designed so as to have various sizes while keeping high thermal conductivity, it can be used as a moulded body in a wide range of use applications.

{Preparation of Slurry}

<Raw Material BN Powder>

Kind of Raw Material BN Powder

Examples of raw material BN powder which can be used in the present invention include, without limitation, commercial h-BN, commercial α- and β-BNs, BN fabricated by a reduction nitridation of a boron compound and ammonia, BN synthesized from a boron compound and a nitrogen-containing compound such as melamine, but particularly h-BN is preferably used because it exhibits better the effect of the present invention.

Crystallinity of Raw Material BN Powder

A suitable form of raw material BN powder used in the present invention is powder of BN particles having a wide width at half maximum of the peak obtained by a powder X-ray diffraction measurement and low crystallinity. As a standard of the crystallinity, the width at half maximum of the (002) plain peak obtained from the powder X-ray diffraction measurement is, by the angle of 2θ, usually 0.4° or more, preferably 0.45° or more, more preferably 0.5° or more. It is usually 2.0° or less, preferably 1.5° or less, more preferably 1° or less. If it is greater than the above-mentioned upper limit, crystallites do not grow sufficiently and require a long time to grow, and as a result, productivity tends to worsen. If it is lower than the above-mentioned lower limit, sufficient crystal growth cannot be prospected because of too high crystallinity, and dispersive stability during slurry fabrication tends to worsen. The powder X-ray diffraction measurement method will be described later in Examples.

Concentration of Oxygen Atom in Raw Material BN Powder

From the viewpoint of BN crystal growth, oxygen atoms preferably exist to some extent in the raw material BN powder, and in the present invention, the total oxygen concentration in the raw material BN powder is usually 1% by mass or more, preferably 2% by mass or more, more preferably 3% by mass or more, still more preferably 4% by mass or more. It is usually 10% by mass or less, more preferably 9% by mass or less. If it is greater than the above-mentioned upper limit, oxygen tends to remain even after thermal treatment, and as a result, the effect of improving thermal conductivity tends to be small. If it is lower than the above-mentioned lower limit, crystal growth cannot be prospected because of high crystallinity, and the peak intensity ratio confirmed from a powder X-ray diffraction measurement tends to deviate from the desirable range.

In the present invention, the average crystallite size of the BN primary particles constituting agglomerated BN particles can be also controlled within the desirable range by using a raw material having oxygen concentration of 1.0% by weight or more in the raw material BN powder.

Examples of methods to adjust the total oxygen concentration of the raw material BN powder within the above-mentioned range include, for example, a method of synthesizing BN at low temperature of 1500° C. or lower and a method of subjecting, to heat treatment, the raw material BN powder in oxidative atmosphere at a low temperature of 500° C.-900° C.

The total oxygen concentration of the raw material BN powder can be measured by the inert gas fusion-infrared absorption method by using an oxygen/nitrogen analyzer from HORIBA, Ltd.

Total Pore Volume and Specific Surface Area of Raw Material BN Powder

The total pore volume of the raw material BN powder is usually 1.0 cm$^3$/g or less, and it is preferably 0.3 cm$^3$/g or more 1.0 cm$^3$/g or less, more preferably 0.5 cm$^3$/g or more and 1.0 cm$^3$/g or less. As the raw material BN powder is closely packed due to the total pore volume of 1.0 cm$^3$/g or less, a granulation with high sphericity can be possible.

The specific surface area of the raw material BN powder is usually 50 m$^2$/g or more, and it is preferably 60 m$^2$/g or more, and more preferably 70 m$^2$/g or more. It is usually 1,000 m$^2$/g or less, and is preferably 500 m$^2$/g or less, and more preferably 300 m$^2$/g or less. The specific surface area of the raw material BN powder which is 50 m$^2$/g or more is preferable because the diameter of dispersed particles in the BN slurry used in spherization by granulation can be decreased. In addition, 1,000 m$^2$/g or less is preferable because increase in the slurry viscosity can be suppressed.

The total pore volume of the raw material BN powder can be measured by the nitrogen absorption method and the mercury intrusion method, and the specific surface area can be measured by the single point BET method (absorption gas nitrogen). Specific measurement methods of the total pore volume and of the specific surface area of the raw material BN powder will be described later in the section of Examples.

<Medium>

Although medium used in preparation of the BN slurry is not particularly limited and water and/or various organic solvents can be used, water is preferable from the viewpoint of, for example, easiness of spray-drying and simplicity of apparatuses, and pure water is more preferable.

The quantity of medium to be used for preparation of the BN slurry is preferably a quantity added so that the viscosity of the BN slurry is 200-5000 mPa·s.

Specifically, the quantity of medium to be used for preparation of the BN slurry is usually 10% by mass or more, preferably 20% by mass or more, more preferably 30% by mass or more, and it is usually 70% by mass or less, preferably 65% by mass or less, more preferably 60% by mass or less. If the quantity of medium to be used is greater than the above-mentioned upper limit, the homogeneity of the BN slurry, for example, by sedimentation is impaired because of the too low slurry viscosity, and the crystallite size of the BN primary particles constituting agglomerated BN particles to be obtained tends to deviate from the desirable range. If it is lower than lower limit, granulation tends to be difficult because of the too high slurry viscosity. In other words, if the quantity of the above-mentioned medium to be used deviates from the above-mentioned range, it become difficult to satisfy simultaneously the size of the agglomerated BN particles, the crystallinity of the BN primary particles constituting agglomerated BN particles, and reduction of the grain boundary in the BN primary particles.

<Surfactant>

To the BN slurry are preferably added various surfactants from the viewpoint of regulation of the slurry viscosity and dispersive stability of the raw material BN powder in the slurry (prevention of agglomeration).

Surfactants which can be used are, for example, anionic surfactants, cationic surfactants, and non-ionic surfactants, and these can be used singly or in combination of the two or more kinds.

In general, surfactants can change slurry viscosity. Accordingly, when a surfactant is added to the BN slurry, the quantity of the surfactant is adjusted to a quantity so that the viscosity of the BN slurry is 200-5000 mPa·s. For example, when a slurry with a solid content of 50% by mass is prepared by using BN, as a raw material BN, having a width at half maximum 2θ of the (002) plane peak of 0.67° obtained from a powder X-ray diffraction measurement and an oxygen concentration of 7.5% by mass, an anionic surfactant is usually added in an amount of 0.01% by mass or more, preferably 0.05% by mass or more, more preferably 0.1% by mass or more with respect to total quantity of the slurry, and usually 10% by mass or less, preferably 7% by mass or less, more preferably 5% by mass or less, more preferably 3% by mass or less. If it is greater than the above-mentioned upper limit, the slurry viscosity tends to become too low, and a carbon component originated from the surfactant tends to remain in produced agglomerated BN particles. If it is lower than the above-mentioned lower limit, granulation itself tends to be difficult because of the too high slurry viscosity.

<Binder>

The BN slurry can include a binder in order to granulate effectively raw material BN powder into the particulate form. The binder binds the BN primary particles tightly and acts to stabilize the granulated particles.

Any binder can be used for the BN slurry so long as it can enhance adhesiveness between the BN particles, but granulated particles are subjected to heating treatment after granulation in the present invention, and therefore, a binder which has thermal resistance against high temperature conditions in this heating treatment process is preferable.

Examples preferably used as such a binder include metal oxides, such as aluminum oxide, magnesium oxide, yttrium oxide, calcium oxide, silicon oxide, boron oxide, cerium oxide, zirconium oxide, and titanium oxide. Among them, aluminum oxide and yttrium oxide are suitable from the viewpoint, for example, of thermal conductivity and thermal resistance for an oxide, and of binding strength to bind the BN particles. The binder may be a liquid binder such as alumina sol or a binder which is transformed into another inorganic component through a reaction during heating treatment. These binders can be used singly or in combination of the two or more kinds.

The quantity of the binder to be used (quantity as a solid content to be used in the case of the liquid binder) is usually 0% by mass or more and 30% by mass or less with respect to the raw material BN powder in the BN slurry, and preferably 0% by mass or more and 20% by mass or less, more preferably 0% by mass or more and 15% by mass or less. If the quantity exceeds the above-mentioned upper limit, the content of the raw material BN powder in the granulated particles decreases, not only affecting crystal growth, but also diminishing the effect of improving thermal conductivity when the agglomerated BN particles are used as thermally conductive filler.

<Method of Preparing Slurry>

Although methods of preparing slurry are not particularly limit so long as the raw material BN powder and the medium, and as necessary, the binder and the surfactant are uniformly dispersed and prepared within a desirable viscosity range, the preparation is preferably as follows when the raw material BN powder and the medium, and as necessary, the binder and the surfactant are used.

A predetermined amount of the raw material BN powder is weighed into a bottle made of resin, and then, a predetermined amount of the binder is added. Then, a predetermined amount of the surfactant is added, and then a ceramic zirconia ball is added, followed by stirring for 0.5-5 hours on a pot mill rotating table until a desirable viscosity is achieved.

Although the order of the addition is not particularly limited, agglomerates such as lumps tend to be generated when a large amount of the raw material BN powder is made to be slurry, and therefore, an aqueous solution including the surfactant and the binder may be prepared before a predetermined amount of the raw material BN powder is gradually added, and then, a ceramic zirconia ball is added, followed by dispersion and slurrying on the pot mill rotating table.

For the dispersion, a dispersing apparatus, such as a beads mil, and a planetary mixer, other than the pot mill may be used. Slurrying is carried out at a slurry temperature of 10° C. or more and 60° C. and or less. If the temperature is lower than the lower limit, the slurry viscosity tends to increase and deviate from a desirable viscosity range, and if it is higher than the upper limit, the raw material BN powder tends to decompose into ammonia in the aqueous solution. It is usually 10° C. or more and 60° C. or less, and is preferably 15° C. or more and 50° C. or less, more preferably 15° C. or more and 40° C. or less, more preferably 15° C. or more and 35° C. or less.

{Granulation}

In order to obtain granulated particles from the BN slurry, a general granulating method can be used such as the spray-drying method, the rolling method, the fluidized bed method, and the stirring method, and among them, the spray-drying method is preferable.

By the spray-drying method, granulated particles of a desirable size can be produced depending on the concentration of the slurry as a raw material, the quantity of the delivered liquid per hour introduced into the apparatus, and the pressure and quantity of compressed air for spraying the delivered slurry, and spherical granulated particles can be also obtained. Although the spray-drying apparatus to be used is not limited, in order to make larger spherical granulated particles, an apparatus having a rotating disk is most suitable. Examples of such an apparatus include Spray Dryer F Series from Ohkawara Kakohki Co., Ltd. and a spray dryer "MDL-050M" from Fujisaki Electric Corporation.

When the range of the average particle diameter of the agglomerated BN particles of the present invention based on volume is made to be preferably 5 μm or more and 200 μm or less, the average particle diameter of the granulated particles obtained by granulation is usually 3 μm or more, preferably 5 μm or more, more preferably 10 μm or more, more preferably 15 μm or more, still more preferably 20 μm or more, particularly preferably 25 μm or more, even preferably 26 μm or more, even preferably 30 μm or more, and even preferably 35 μm or more, by average particle diameter $D_{50}$ based on volume. It is also preferably 150 μm or less, and more preferably 100 μm or less. The average particle diameter $D_{50}$ of the granulated particles based on volume can be measured, for example, by "LA920" from HORIBA, Ltd. for wet methods, and "Morphorogi" from Malvern Instruments Ltd. for dry methods.

{Heating Treatment}

The above-described BN granulated particles can be subjected to heating treatment under non-oxidative gas atmosphere to produce agglomerated BN particles.

The non-oxidative gas atmosphere means atmosphere, for example, of nitrogen gas, helium gas, argon gas, ammonia gas, hydrogen gas, methane gas, propane gas, and carbon monoxide gas. The crystallization rate of the agglomerate BN particles varies depending on the kind of the atmosphere gas to be used, and in order to achieve rapid crystallization, nitrogen gas or a combination of nitrogen gas and other gases is particularly suitably used.

The temperature of heating treatment is usually 1800° C. or more and 2300° C. or less, preferably 1900° C. or more and preferably 2200° C. or less. If the temperature of heating treatment is too low, average BN crystallites grow insufficiently, and the thermal conductivity of the agglomerated BN particles and a moulded body thereof may be small. If the temperature of heating treatment is too high, degradation of the BNs are likely to occur.

By adjusting the above-mentioned temperature of heating treatment to 1800° C. or more and 2300° C. or less, the peak intensity ratio ((100)/(004)) of the (100) plane to the (004) plane of the BN primary particles can be a desirable value.

Duration of heating treatment is usually 3 hours or more, preferably 4 hours or more, more preferably 5 hours or more, and is usually 20 hours or less, preferably 15 hours or less. If the duration of heating treatment is lower than the above-mentioned lower limit, the crystal growth is insufficient, and if it exceeds the above-mentioned upper limit, BNs are likely to decompose partially.

Because the heating treatment is carried out in non-oxidative gas atmosphere, a calcinating furnace is preferably usually evacuated by a vacuum pump, and then heated up to a desirable temperature while non-oxidative gas is kept introduced, but if substitution by the non-oxidative gas can be carried out sufficiently in the calcinating furnace, the temperature may be raised in an ambient pressure while the non-oxidative gas is kept introduced. Examples of the calcinating furnaces include a batch type furnace such as a muffle furnace, a tubular furnace, and an atmosphere furnace, and a continuous furnace such as a rotary kiln, a screw conveyer furnace, a tunnel furnace, a belt furnace, pusher furnace, and a vertical continuous furnace, and they are selected depending on their use purposes.

Usually, granulated particles to be subjected to the heating treatment are, in order to reduce inhomogeneity of the composition during calcination, placed in a circular crucible of graphite, and then, heated and calcinated. At this time, partitions of graphite may be placed in order to suppress the sintering of the agglomerated BN particles due to calcination as well as to reduce the inhomogeneity of the composition. Although the number of divisions by the partitions is not particularly limited so long as the sintering is suppressed, the number is usually 2 or more and 16 or less. If the number is more than the above-mentioned upper limit, the sintering can be suppressed, but crystals of the BN primary particles tend not to grow sufficiently, and if it is fewer than the above-mentioned lower limit, the sintering tends to proceed.

{Classifying}

The agglomerated BN particles after the above-mentioned heating treatment are preferably subjected to classifying treatment in order to narrow the particle diameter distribution and suppress increase in viscosity at the time when the particles are contained to prepare a resin composition including agglomerated BN particles. This classifying is usually carried out after the heating treatment of the granulated particles, but it may be carried out for the granulated particles prior to the heat treatment, and then, they may be subjected to the heat treatment.

The classifying may be either dry or wet, but dry classifying is preferable from the viewpoint of suppressing the decomposition of the BNs. In particular, when the binder is water-soluble, dry classifying is particularly preferably used.

Examples of the dry classifying include, in addition to classifying by a sieve, air classifying which utilizes the difference between centrifugal force and fluid drag, and the classifying may be carried out by using a classifier such as an aero-fine-classifier, a forced vortex centrifugal classifier, and a semi-free vortex centrifugal classifier. The classifier may be selected depending on the diameter of the particles to be classified, and among them, for example, the aero-fine-classifier for classifying micro-particles of a size within the range from submicron to a single micron, and the semi-free vortex centrifugal classifier for relatively large particles of a size greater than the range can be used.

[Resin Composition Including Agglomerated BN Particles]

The resin composition including agglomerated BN particles of the present invention at least includes the agglomerated BN particles of the present invention and a resin. The agglomerated BN particles of the present invention are suitably used, due to their characteristics relating to their shape, as filler of the resin composition including agglomerated BN particles.

The content proportion of the agglomerated BN particles in the resin composition including agglomerated BN particles (hereinafter, also referred to as "filling quantity of filler") is, with respect to 100% by mass of the agglomerated BN particles and the resin in total, usually 5% by mass or more, preferably 30% by mass or more, more preferably 50% by mass or more, and usually 95% by mass or less, preferably 90% by mass or less. If it is larger than the above-mentioned upper limit, not only the viscosity tends to be too high to secure processability of a moulded body, but also tight filling of the agglomerated BN particles is inhibited, and as a result, thermal conductivity tends to decrease, and if it is lower than the above-mentioned lower limit, although processability of the moulded body is secured, the agglomerated BN particles are too little, and the thermal conductivity tends not to be improved.

The resin composition including agglomerated BN particles according to another aspect of the present invention (second summaries) at least includes agglomerated BN particles (A) having the above-mentioned specific physical properties and inorganic particles (B) different from the agglomerated BN particles.

Any inorganic particles (B) different from the agglomerated BN particles (A) having the above-mentioned specific physical properties may be used without any particular limitation. In particular, examples thereof include boron nitride, aluminum nitride, alumina, zinc oxide, magnesium oxide, beryllium oxide, titanium oxide, and one or more selected from the group are preferable, and in particular, boron nitride is preferable from the viewpoint of reducing heat resistance.

The agglomerated BN particles (A) and the inorganic particle (B) to be used preferably satisfy the relation, volume average particle diameter ($D_{50}$) of agglomerated BN particles (A)>volume average particle diameter ($D_{50}$) of inorganic particle (B). If this is not satisfied, the particles cannot be packed closely, resulting in reduction of thermal conductivity. The $D_{50}$ of the inorganic particle (B) is preferable 0.95 times or less of the $D_{50}$ of the agglomerated BN particles (A), more preferably 0.8 times or less, particularly preferably 0.5 times or less. When it is within the range, voids existing between the agglomerated BN particles having the above-mentioned specific physical properties can be filled without any gap, and heat resistance and defects in the composition can be reduced sufficiently, and as a result, a moulded body obtained from the composition including them has high thermal conductivity and voltage resistance.

Although the lower limit of the ratio of the volume averaged particle diameter of the inorganic particles (B) to that of the agglomerated BN particles (A) is not particularly limited so long as it satisfies the above-mentioned value, it is usually 0.01 times or more, preferably 0.05 times or more, from the viewpoint of easiness to handle the inorganic particles (B) and the reason that it tends not to change so greatly the heat resistance and the effect of reducing the defects in the composition.

The volume averaged particle diameter of the inorganic particles (B) is usually 100 μm or less, preferably 60 μm or less, but on the other hand, 0.5 μm or more, preferably 1 μm or more, more preferably 3 μm or more. If it is within this range, a high voltage resistant performance and a high thermal conductivity tend to be obtained because voids between the particles can be filled efficiently.

So long as the relation, volume average particle diameter ($D_{50}$) of agglomerated BN particles (A)>volume average particle diameter ($D_{50}$) of inorganic particle (B), is satisfied, the inorganic particle (B) may be the agglomerated particles.

(Component Proportion of Composition Including Agglomerated BN Particles)

The content proportion of the agglomerated BN particles (A) in the composition including agglomerated BN particles is, with respect to the agglomerated BN particles (A) and the inorganic particle (B) in total, usually 30% by mass or more, preferably 50% by mass or more, and usually 95% by weight or less, preferably 90% by mass or less. If it is within this range, the agglomerated particles tend to cause percolation, resulting in high thermal conductivity.

The content proportion of the agglomerated BN particles (A) and the inorganic particle (B) in total in the composition including agglomerated BN particles (hereinafter also referred to as "filling quantity of filler") is, with respect to the agglomerated BN particles (A), the inorganic particle (B), and the resin to be 100% by mass in total, usually 5% by mass or more, preferably 30% by mass or more, more preferably 50% by mass or more, and is usually 95% by mass or less, preferably 90% by mass or less. If it is within the above-mentioned range, formability of a moulded body produced by using the composition can be secured, and the thermal conductivity of the resultant moulded body tends to be good.

<Resin>

Resins used for the resin composition including agglomerated BN particles are not particularly limited, and is preferably setting resins and/or thermoplastic resins. Examples of the setting resins include thermosetting, light setting, electron-beam setting types, and thermosetting resins and/or thermoplastic resins are preferable from the viewpoint of, for example, thermal resistance, water absorbing property, and dimensional stability, and among them, epoxy resins are more preferable. These resins can also be used in combination of the two or more kinds.

The epoxy resin may be a epoxy resin having a single structural unit, but may be a combination of plural epoxy resins having different structure units. The epoxy resin is used along with a curing agent for epoxy resin and a curing promoter, if necessary.

When the epoxy resin is used, its Tg is not particularly limited, but is usually 0° C. or more, preferably 10° C. or more, more preferably 25° C. or more, and usually 350° C. or less, preferably 300° C. or less, more preferably 250° C. or less.

At least a phenoxy resin described later (hereinafter also referred to as "epoxy resin (A)") is preferably included as an epoxy resin, not only from the viewpoint of coating or film deposition properties and adhesiveness, but also in order to obtain a hardened product having high thermal conductivity and reduced voids. The mass ratio of the epoxy resin (A) to the total amount of the epoxy resin is not particularly limited, but is within the range from preferably 5% by mass or more, more preferably 10% by mass or more, still more preferably 15% by mass or more, particularly preferably 16.0% by mass or more, still particularly preferably 18.0% by mass or more, to preferably 95% by mass or less, more preferably 90% by mass or less, still more preferably 80% by mass or less.

The phenoxy resin usually means a resin obtained through a reaction of epihalohydrin and a divalent phenol compound, or a resin obtained through a reaction of a divalent epoxy compound and a divalent phenol compound, and among them, it means, in the present invention, the epoxy resin (A) which is a phenoxy resin having a high molecular weight of 10,000 or more by weight-average molecular weight.

The weight-average molecular weight is a value based on a polystyrene standard, measured by gel permeation chromatography.

Preferable examples of the epoxy resin (A) include a phenoxy resin, a bisphenol A type phenoxy resin, a bisphenol F type phenoxy resin, a naphthene type phenoxy resin, a phenol novolak type phenoxy resin, a cresol novolak type phenoxy resin, a phenol aralkyl type phenoxy resin, a biphenyl type phenoxy resin, a triphenyl methane type phenoxy resin, a dicyclopentadiene type phenoxy resin, a glycidyl ester type phenoxy resin, and a glycidyl amine type phenoxy resin, having at least one backbone selected from the group consisting of a naphthene backbone, a fluorene backbone, a biphenyl backbone, a anthracene backbone, a pyrene backbone, a xanthene backbone, an adamanthane backbone, and a dicyclopentadiene backbone. Among them, the phenoxy resin having a fluorene backbone and/or a biphenyl backbone, the bisphenol A type phenoxy resin, and the bisphenol F type phenoxy resin are particularly preferable because thermal resistance and adhesiveness can be enhanced.

These may be used singly or in combination of the two or more kinds.

The epoxy resin according to the present invention preferably includes, other than the above-mentioned epoxy resin (A), an epoxy resin having intramolecularly two or more epoxy groups (hereinafter also referred to as "epoxy resin (B)"). Examples of the above-mentioned epoxy resin (B) include various epoxy resins, for example, the bisphenol A type epoxy resin, the bisphenol F type epoxy resin, the naphthene type epoxy resin, the phenol novolak type epoxy resin, the cresol novolak type epoxy resin, the phenol aralkyl type epoxy resin, the biphenyl type epoxy resin, the triphenyl methane type epoxy resin, the dicyclopentadiene type epoxy resin, the glycidyl ester type epoxy resin, the glycidylamine-type epoxy resin, and a multi-functional phenol type epoxy resin. Among them, the bisphenol A type epoxy resin, the bisphenol F type epoxy resin, the glycidylamine-type epoxy resin, the multi-functional phenol type epoxy resin are preferable from the viewpoint of improvement of thermal resistance and adhesiveness.

These may be used singly or in combination of the two or more kinds.

The above-mentioned epoxy resins (B) have, from the viewpoint of controlling melt viscosity, a weight-average molecular weight of preferably 100-5000, more preferably 200-2000. Those which have a weight-average molecular weight lower than 100 tend to have inferior thermal resistance, and those which have more than 5,000 tend to have inferior workability due to increase in melting temperature of the epoxy resins.

The epoxy resin according to the present invention may include epoxy resins other than the epoxy resin (A) and the epoxy resin (B) (hereinafter also referred to as "other epoxy resins") so long as they do not impair the object of the epoxy resin. The content of the other epoxy resins are, with respect to the epoxy resin (A) and the epoxy resin (B) in total, usually 50% by mass or less, preferably 30% by mass or less.

The curing agent for epoxy resin is selected, as necessary, depending on the kind of the resins to be used. Examples of the agent include, for example, curing agents based on acid anhydride and amine-based curing agents. Examples of the curing agents based on acid anhydride include, for example, tetrahydrophthalic anhydride, methyltetrahydrophthalic anhydride, hexahydrophthalic anhydride, and benzophenone tetracarboxylate anhydride. Examples of the amine-based curing agents include, for example, aliphatic polyamines such as ethylenediamine, diethylene triamine, and triethylene tetramine, aromatic polyamines such as diaminodiphenylsulfone, diaminodiphenylmethane, diaminodiphenyl ether, m-phenylenediamine, and dicyandiamide. These may be used singly or in combination of the two or more kinds. These curing agents for epoxy resin are usually combined in an equivalent ratio within the range of 0.3 or more and 1.5 or less with respect to the epoxy resin.

The curing promoter is selected, as necessary, depending on the kind of the resins and the curing agents to be used. Examples of the curing promoter for the curing agents based on acid anhydride include, for example, boron trifluoride monoethyl amine, 2-ethyl-4-methyl imidazole, 1-isobutyl-2-methyl imidazole, and 2-phenyl-4-methyl imidazole. These can be used singly or in combination of the two or more kinds. These curing promoters are usually used in the range of 0.1 parts by mass or more and 30 parts by mass or less with respect to 100 parts by mass of the epoxy resin.

The resin in the resin composition including agglomerated BN particles of the present invention may be a thermoplastic resin. Examples of the thermoplastic resin include, for example, polyolefin resins such as polyethylene resin, polypropylene resin, and ethylene-vinyl acetate copolymer resin, polyester resins such as polyethylene terephthalate resin, polybutylene terephthalate resin, and liquid crystal polyester resin, polyvinyl chloride resin, phenoxy resin, acrylic resin, polycarbonate resin, polyphenylene sulfide resin, polyphenylene ether resin, polyamide resins, polyamide imide resins, polyimide resins, polyether amide imide resins, polyether amide resins, and polyether imide resins. They also include copolymers such as block copolymers and graft copolymers thereof. They may be used singly or in combination of the two or more kinds.

The resin in the resin composition including agglomerated BN particles of the present invention may include a rubber component, and examples of the rubber component include, for example, natural rubber, polyisoprene rubber, styrene-butadiene copolymer rubber, polybutadiene rubber, ethylene-propylene copolymer rubber, ethylene-propylene-diene copolymer rubber, butadiene-acrylonitrile copolymer rubber, isobutylene-isoprene copolymer rubber, chloroprene rubber, silicon rubber, fluorine rubber, chlorosulfonated polyethylene, and polyurethane rubber. They may be used singly or in combination of the two or more kinds.

<Other Components>

The resin composition including agglomerated BN particles of the present invention may include additional components so long as it provides the effect of the present invention. Examples of such additional components include, for example, other than the above described resins, nitride particles, such as aluminum nitride, silicon nitride, and fiber-like, plate-like, particle-like agglomerated BNs, which are inorganic fillers, insulating metal oxides, such as alumina, fiber-like alumina, zinc oxide, magnesium oxide, beryllium oxide, and titanium oxide, inorganic fillers, such as diamond, fullerene, aluminum hydroxide, and magnesium hydroxide, surface treatment agents, such as silane coupling agents improving adhesion strength at boundary between the inorganic filler and the matrix resin, insulating carbon components such as reducing agents, resin curing agents, resin curing promoters, viscosity adjusters, and dispersants. Among them, the nitride particles are preferable from the viewpoint of improvement in thermal conductivity and in voltage resistance, and the particle-like agglomerated BN is more preferable.

When the slurry of the present invention is used, dispersants are preferably used for improvement in film depositability.

From the viewpoint of reducing the viscosity of the resin composition including agglomerated BN particles, solvents can be used for the resin composition including agglomerated BN particles of the present invention. A solvent which dissolves the resin is selected from well-known solvents. Examples of such a solvent include, for example, an organic solvent, such as methylethyl ketone, acetone, cyclohexanone, toluene, xylene, monochlorobenzene, dichlorobenzene, trichlorobenzene, phenol, and hexafluoro isopropanol.

They may be used singly or in combination of the two or more kinds.

The solvent is usually used within the range of 0-10,000 parts by mass with respect to 100 parts by mass of resin such as the epoxy resin.

[Method of Producing Resin Composition Including Agglomerated BN Particles]

The resin composition including agglomerated BN particles of the present invention can be obtained by mixing uniformly the agglomerated BN particles of the present invention, inorganic particle in some instances, resin, and other components added as necessary, and then, stirring or kneading them. For the mixing, for example, a general kneading apparatuses can be used, such as mixers, kneaders, single-screw or twin-screw kneaders, and the mixing may be accompanied by heating, as necessary.

When the system including the solvent and the resin are in a liquid state and the resin composition including the agglomerated BN particles of the present invention is in a slurry state which has fluidity (herein also referred to as slurry for coating), a preparation method of slurrying is not particularly limited, and conventional well-known methods can be used. At this time, general kneading apparatuses are preferably used for mixing and stirring, such as paint shakers, beads mils, planetary mixers, stirring dispersers, planetary centrifugal mixers, three-rollers, kneaders, and single-screw or twin-screw kneaders, for the purpose of improving uniformity of and defoaming of the coating liquid.

Although the order of mixing each of the components to be combined is arbitrary so long as particular problems such as reaction and deposition do not occur, an exemplary method can be given in which a resin is added and dissolved into an organic solvent (for example, methylethyl ketone) to prepare a resin liquid, to which is added an mixture of the agglomerated BN particles mixed sufficiently with other components described later, and then, an organic solvent for viscosity adjustment is added and mixed, followed by adding and mixing a resin curing agent and a curing promoter, or an additive such as a dispersant.

[Moulded Body of Agglomerated BN Particles]

The moulded body of the present invention is a moulded body obtained by using the agglomerated BN particles of the present invention, and preferably a moulded body obtained by moulding the resin composition including agglomerated BN particles. General methods can be used as methods of moulding the moulded body.

For example, when the resin composition including agglomerated BN particles of the present invention has plasticity or fluidity, the resin composition including agglomerated BN particles can be moulded into a desirable shape by hardening, for example, while placed in a mold.

In production of such a moulded body, injection moulding, injection compression moulding, extrusion moulding, compression moulding, and vacuum compression moulding can be used.

When the above described slurry includes a solvent, well-known heating methods such as hot plates, hot air furnaces, IR furnaces, vacuum driers, high frequency heaters can be used to remove the solvent.

When the resin composition including agglomerated BN particles of the present invention is a composition of thermosetting resin such as epoxy resin or silicone resin, moulding the moulded body, in other words, hardening the moulded body can be carried out at a setting temperature condition for each of the resins.

When the resin composition including agglomerated BN particles of the present invention is a composition of thermoplastic resin, moulding the moulded body can be carried out at a temperature higher than or equal to the melting point of the thermoplastic resin and under the condition of a predetermined moulding rate and pressure.

The moulded body of the present invention can be also obtained by shaving a hardened product of the resin composition including agglomerated BN particles of the present invention into a desirable shape.

Use applications of the agglomerated BN particles of the present invention are preferably heat dissipation sheet (herein, also simply referred to as a sheet) among moulded bodies. A method of producing the heat dissipation sheet is not particularly limited, and methods of producing heat dissipation sheet in conventional technologies can be applicable.

Hereinafter, a method of producing the heat dissipation sheet will be specifically explained which uses the slurry including agglomerated BN particles. The method of producing the sheet at least includes, other than a step of preparing the above described slurry, a step of coating a substrate material with the slurry (coating step), and a step of drying it (drying step), a step of moulding the coated and then dried product under pressure (sheeting step), and a step of thermosetting the moulded product (thermosetting step), as will be described later.

<Coating Process>

First, a coating is formed on the surface of a substrate by using the slurry including agglomerated BN particles.

In other words, the coating is formed, using the slurry, by a dip method, spin coating, spray coating, a blade method, and other optional methods. For applying the coating liquid of the composition, coating apparatuses such as spin coaters, slit coaters, die coaters, blade coaters, comma coaters, screen printing, doctor blades, applicators, and spray coating can be used to form uniformly a coating having a predetermined film thickness on the substrate, and blade coaters are preferable which can adjust a gap.

The sheet of the present invention can be also used as a free-standing film, and further, be formed on well-known substrate materials such as metal foils or plates (copper, aluminum, silver, and gold), a resin film such as PET, PEN, and glass. These substrates can be removed depending on their usage form or may be used in a stack structure of, for example, substrate/heat dissipation sheet/substrate.

Copper foil having a thickness described later is generally used as a substrate, which nevertheless is not at all limited to copper. In addition, the surface of the substrate may have bumps thereon, or be surface-treated.

<Drying Step>

Then, a coated and then dried product is obtained by drying the slurry including agglomerated BN particles applied on the substrate. The drying temperature is usually 15° C. or more, preferably 20° C. or more, more preferably 23° C. or more, and usually 100° C. or less, preferably 90° C. or less, more preferably 80° C. or less, still more preferably 70° C. or less.

If this heating temperature for drying is too low or the heating duration is too short, an organic solvent in the coating cannot be removed sufficiently, and it remains in the resultant dried film, then evaporating in a treatment at high temperature under pressure in the next sheeting step, and as a result, the traces of the evaporated residual solvent become voids, making impossible to form a sheet having high thermal conductivity and high insulating property, and given physical strength. Conversely, if the heating temperature for drying is too high or the heating duration is too long, hardening of the resin proceeds, resulting in an unsatisfactory dried film.

The drying duration is usually 1 hours or more, preferably 2 hours or more, more preferably 3 hours or more, still more preferably 4 hours or more, and usually 168 hours or less, preferably 144 hours or less, more preferably 120 hours or less, still more preferably 96 hours or less.

If this drying duration is lower than the lower limit, the organic solvent in the coating cannot be removed sufficiently, and it remains in the resultant dried film, then evaporating in a treatment at high temperature under pressure in the next sheeting step, and as a result, the traces of the evaporated residual solvent become voids, making impossible to form a sheet having high thermal conductivity and high insulating property, and given physical strength. Conversely, if the drying duration exceeds the upper limit, the resin becomes too dry, not only making impossible to obtain a coating film having good strength, but also inhibiting permeation of enough resin into voids present in the sheet because of inability to obtain enough fluidity even by plasticization of the resin in the sheeting step, and as a result, a formed sheet tends not to be able to have high thermal conductivity, high insulating property, and a given physical strength.

The film thickness of the sheet before drying is usually 100 μm or more, preferably 150 μm or more, more preferably 200 μm or more, still more preferably 300 μm or more, and usually 800 μm or less, preferably 700 μm or less, more preferably 600 μm or less, still more preferably 500 μm or less. If the film thickness exceeds the above-mentioned upper limit, the organic solvent becomes hard to be controlled in terms of its evaporation rate inside the film, and it remains more, then evaporating in a treatment at high temperature under pressure in the sheeting step, and as a result, the traces of evaporated residual solvent become voids, making it impossible to form a sheet having high thermal conductivity, high insulating property, and a given physical strength. Conversely, if the thickness is lower than the lower limit, the resin become too dry due to the evaporation of the organic solvent in a short time, not only making it impossible to obtain a coating film having a good strength but also inhibiting permeation of enough resin into voids present in the sheet because of inability to obtain enough fluidity even by plasticization of the resin in the sheeting step, and as a result, a formed sheet tends not to be able to have high thermal conductivity, high insulating property, and a given physical strength.

At this time, heating treatment may be carried out at a constant temperature, but the heat treatment may also be carried out under a reduced pressure condition in order to remove smoothly a volatile component such as an organic solvent in the coating liquid. The heating treatment may be carried out by raising temperature gradually so long as hardening of the resin does not proceed. For example, the heat treatment can be started at 25-40° C., for example, 30° C., and then at 40-90° C., for example, 50° C., for about 30-60 minutes, respectively.

The quantity of an organic compound having a boiling point of 150° C. or more in the coated and then dried product obtained in this drying step is more than 0 ppm, preferably 0.001 ppm or more, more preferably 0.1 ppm or more, still more preferably 1 ppm or more, and is 1800 ppm or less, preferably 1500 ppm or less, more preferably 1300 ppm or less. If it is within this range, a sheet obtained by this production method exhibits high thermal conductivity and a high voltage resistance value.

The quantity of an organic compound having a boiling point of 100° C. or less in the coated and the dried product is usually more than 0 ppm, preferably 0.01 ppm or more, more preferably 1 ppm or more, still more preferably 5 ppm or more, particularly preferably 7 ppm or more, and usually 50 ppm or less, preferably 30 ppm or less, more preferably 19 ppm or less, still more preferably 18 ppm or less. If it is within the above-mentioned range, the effect of the present invention can be exhibited effectively. The quantity of the above described organic compound in the coated and then dried product can be measured by head-space gas chromatography.

<Sheeting Step>

After the drying step, a step of pressurizing and moulding the coated and then dried product (sheeting step) is carried out. In the sheeting step, the coated and then dried product applied on the copper substrate and then dried is usually cut into a predetermined size.

The heating temperature in the sheeting step (press temperature) is usually 80° C. or more, preferably 90° C. or more, more preferably 100° C. or more, still more preferably 110° C. or more, and usually 300° C. or less, preferably 250° C. or less, more preferably 200° C. or less.

If this heating temperature is lower than the above-mentioned lower limit, thermosetting reaction does not proceed sufficiently, and the contact between the agglomerated BN particles and the contact between the agglomerated BN particle and the resin boundary become insufficient, making it impossible to form a sheet having high thermal conductivity, high insulating property, and a predetermined physical strength. Conversely, if it exceeds the upper limit of the range, degradation of the resin is likely to occur, and voids and lowering of the molecular weight due to the degradation tends to make it impossible to form a sheet having high thermal conductivity, high insulating property, and a given physical strength.

A press method in a pressurizing step carried out to promote adhesion to the above-mentioned copper substrate (press treatment) can be carried out by using well-known technologies, which include, for example, hydrostatic press, vacuum press, belt press, heat press, servo press, and calender roll.

The press pressure applied to the dried film on the copper substrate is usually 10 kgf/cm$^2$ or more, preferably 150 kgf/cm$^2$ or more, more preferably 200 kgf/cm$^2$ or more, still more preferably 250 kgf/cm$^2$ or more, and usually 2000 kgf/cm$^2$ or less, preferably 1000 kgf/cm$^2$ or less, more preferably 900 kgf/cm$^2$ or less, still more preferably 800 kgf/cm$^2$ or less. If this load during pressurizing is lower than or equal to the above-mentioned upper limit, a sheet having high thermal conductivity and no voids can be obtained without breaking the agglomerated BN particles. If the load is higher than or equal to the above-mentioned lower limit, the contact between the agglomerated BN particles becomes good and tends to form paths of thermal conductivity, and as a result, a sheet having high thermal conductivity can be obtained.

Particularly in the sheeting step undergoing a thermosetting step, the load within the above described range is preferably applied for pressurizing and hardening to be carried out.

In the thermosetting step, the pressurizing step is carried out in which the composition film applied to the copper substrate and then dried is pressurized by a predetermined load usually at a temperature of 80° C. or more, preferably 100° C. or more, for example, at a temperature of 100-200° C., for about 1-30 minutes, to decrease the melt viscosity of the resin in the applied and then dried film and to proceed simultaneously setting reaction to some extent in order to promote the adhesion of the film to the copper substrate, and then hardening step is carried out in which the resin film is heated for complete hardening at a desirable setting temperature of, for example, 150° C. or more for about 2-4 hours in, for example, an oven to proceed the setting reaction to fabricate a sheet. In the setting step, the upper limit of the heating temperature for complete hardening is a temperature at which the resin neither decomposes nor deteriorates, and which is appropriately determined by the kind and grade of the resin, but is usually 300° C. or less.

A circuit board having a heat dissipation sheet which is the sheet of the present invention formed by using the agglomerated BN particles and sandwiched by copper sheets is suitable for a heat dissipation substrate or a heat dissipation sheet for power semiconductor devices because the heat dissipation effect due to the unprecedentedly high thermal conductivity enables high powered and highly integrated devices with high reliability, only thanks to utilization of the agglomerated BN filler of the present invention. In power semiconductor devices, well-known members other than the heat dissipation sheet of the present invention can be appropriately used for aluminum wire, a sealing material, a package material, heat sink, thermal paste, a solder material.

The circuit board is basically in a form which has the heat dissipation sheet of the present invention both surfaces of which are stacked to copper or aluminum and preferably copper, and has circuit patterns formed on the one side of the board. The stacking can also be carried out by press moulding for film formation as mentioned above.

Methods of circuit board patterning are not particularly limited, and are carried out by an existing method, for example, as described in JP-A-2014-209608. The layer thickness of the circuit board is also not particularly limited, but is usually 10 μm or more, preferably 100 μm or more, more preferably 300 μm or more, still more preferably 500 μm or more, particularly preferably 1000 μm or more. It is also usually 5000 μm or less.

The layer thickness of the heat dissipation sheet portion is also not particularly limited, but is usually 80 μm or more, preferably 100 μm or more, more preferably 200 μm or more. It is also usually 1000 μm or less.

The layer thickness of the copper portion which is a heat dissipation portion is also not particularly limited, but is usually 10 μm or more, preferably 100 μm or more, and more preferably 300 μm or more, particularly preferably 500 μm or more, particularly preferably 1000 μm or more. It is also usually 5000 μm or less.

Physical Properties of Sheet

The sheet of the present invention is a sheet including agglomerated boron nitride particles (hereinafter referred to as "agglomerated BN particles"), wherein the peak intensity ratio [(100)/(004)] of the (100) plane to the (004) plane of the boron nitride primary particles (hereinafter referred to as "BN primary particles") in the sheet obtained by subjecting the sheet to an X-ray diffraction measurement is 1.0 or more, and the average crystallite diameter of the BN primary particles from the (002) plane peak of the BN primary particles in the sheet obtained by subjecting the sheet to an X-ray diffraction measurement is 375 Å or more.

As a result of satisfying such physical properties, the sheet of the present invention become a sheet having a high thermal conductivity and an excellent voltage resistant performance, and it can be suitably used as a heat dissipation member. The reason why the sheet exhibits such excellent performances is that the sheet has an increased proportion of the ab plane of the BN primary particles orientated in a direction perpendicular to the sheet and exhibits, as a sheet, the high thermal conductivity possessed by BNs due to an intensity ratio [(100)/(004)] higher than the above value, and that the size of the primary particles controlled to be 375 Å or more decreases the boundary between the primary particles and prevents the boundary from becoming heat resistance.

The sheet is a sheet including at least agglomerated boron nitride particles, wherein the peak intensity ratio ((100)/(004)) of the (100) plane to the (004) plane of the BN primary particles in the sheet obtained by an X-ray diffraction measurement is 1.0 or more. This peak intensity ratio ((100)/(004)) is preferably 1.5 or more, more preferably 2.0 or more, still more preferably 2.5 or more, particularly preferably 3.0 or more. The upper limit is not particularly limited, but is usually 10.0 or less, preferably 7.0 or less, more preferably 5.0 or less.

If this value is too large, the proportion of the BN primary particles oriented in a direction perpendicular to the sheet plane become too high, and micro-cracks are likely to be created in the sheet during a moulding step such as the press step. Such cracks tend to deteriorate an electrical property such as voltage resistance. If this value is too low, the proportion of the BN primary particles oriented in a direction perpendicular to the sheet plane become too low, thermal conductivity tends to be low.

In addition, the average crystallite diameter of the BN primary particles obtained from the (002) plane peak of the BN primary particles in the sheet obtained by subjecting the sheet to an X-ray diffraction measurement is not particularly limited, but is usually 300 Å or more, preferably 320 Å or more, more preferably 375 Å or more, and still more preferably 380 Å or more, still more preferably 390 Å or more, particularly preferably 400 Å or more, and usually 5000 Å or less, preferably 2000 Å or less, more preferably 1000 Å or less.

If this value is too large, a card-house structure in the agglomerated particles is broken during sheet moulding such as the press step, and the proportion of the ab plane of the BN primary particles oriented in a direction perpendicular to the sheet plane decreases, and as a result, thermal conductivity tends to decrease. If the value is too small, the boundary of the BN primary particles tends to increase and become heat conduction resistance, resulting in increase in thermal conductivity.

The sheet of the present invention is a sheet having at least agglomerated boron nitride particles, wherein the peak area intensity ratio ((100)/(004)) of (100) plane to (004) plane of the BN primary particles in the sheet obtained by X-ray diffraction measurement is not particularly limited, but is usually 0.6 or more, preferably 0.65 or more, preferably 0.7 or more, more preferably 0.75 or more, still more preferably 0.8 or more, particularly preferably 0.85 or more. The upper limit is not particularly limited, but is usually 10.0 or less, preferably 5.0 or less, more preferably 4.0 or less.

If this value is too large, the card-house structure in the agglomerated particles is broken, and the proportion of the ab plane of the BN primary particles oriented in a direction perpendicular to the sheet plane decreases, and as a result, thermal conductivity tends to decrease. If the value is too small, the boundary of the BN primary particles tends to increases and become conduction resistance, resulting in decrease in thermal conductivity.

The thermal conductivity of the heat dissipation sheet (W/mK) is not particularly limited, but is usually 5 W/mK or more, preferably 10 W/mK or more, more preferably 13 W/mK or more, particularly preferably 15 W/mK or more, still particularly preferably 17 W/mK or more.

The voltage resistant performance is usually 10 kV/mm or more, preferably 15 kV/mm or more, particularly preferably 20 kV/mm or more. The glass transition temperature of the sheet of the present invention is usually 100° C. or more, preferably 130° C. or more, particularly preferably 175° C. or more.

The adhesion strength of the heat dissipation sheet (N/cm) is not particularly limited, but is usually 0.5 N/cm or more, preferably 1 N/cm or more, more preferably 2 N/cm or more, particularly preferably 3 N/cm or more, still particularly preferably 5 N/cm or more.

EXAMPLES

Hereinafter, the present invention is more specifically explained by Examples, but it is not limited by the following Examples so long as it does not depart from the spirit of the invention. Various conditions and values of evaluation results of the following Examples indicates a preferable scope of the present invention as it is for the preferable scopes in the aspects of the present invention, and the preferable scope of the present invention can be determined in view of a scope represented by the combination of the preferable scopes in the above-described aspects and values in the following Examples or by the combination of the values in the Examples.

{Measurement Conditions}

The properties in the present invention were measured by the following methods.

Viscosity:

A rotatory viscometer "VISCO BASIC Plus R" from FUNGILAB was used at a blade-rotation speed of 100 rpm for the measurement.

Average Particle Diameter of Agglomerated BN Particles ($D_{50}$):

$D_{50}$ (μm) of the agglomerated BN particles was measured by using "Morphologi" from Malvern Instruments Ltd.

Average Crystallite Size of BN Primary Particles:

The average crystallite size was obtained by using the Scherrer formula from a peak derived of the (002) plane of the BN primary particles obtained by a powder X-ray diffraction measurement. The powder X-ray diffraction measurement was carried out by using an X-ray diffractometer "X'Pert Pro MPD" from PANalytical B.V. The Scherrer formula is the following formula, $$D=(K \cdot \lambda)/(\beta \cdot \cos \theta),$$

where D is a crystallite diameter, K is the Scherrer constant, λ is X-ray (CuKα$_1$) wavelength, β is width at half maximum of the peak, and θ is the Bragg angle derived from CuKα$_1$. The β was obtained by using the following correction formula, $$\beta=(\beta_o^2-\beta_i^2)^{0.5},$$

where $\beta_i$ is a width at half maximum of the peak derived from the apparatus previously obtained by using standard Si, and $\beta_o$ is width at half maximum of the peak derived from the (002) plane of the h-BN. For each of the constants, the following values were used, K=0.9, λ=1.54059 Å.

Peak Intensity Ratio of Agglomerated BN Particles

The peak intensity ratio of the agglomerated BN particles was evaluated by calculating the peak intensity ratio ((100)/(004)) of the (100) plane to the (004) plane of the BN primary particles obtained by subjecting the agglomerated BN particles to the powder X-ray diffraction measurement. The powder X-ray diffraction measurement is carried out by using an X-ray diffractometer "X'Pert Pro MPD" from PANalytical B.V.

The above-mentioned powder X-ray diffraction measurement was carried out using a sample prepared by filling a glass sample plate having a depth of 0.2 mm with agglomerated BN particles in such a way that the measurement surface becomes smooth.

Peak Area Intensity Ratio of Agglomerated BN Particles

A powder pellet moulding machine (10 mmφ) was filled with 0.2 g of agglomerated BN particles, which were then moulded into a pellet at a press pressure of 0.85 ton/cm$^2$ by using a hydraulic hand pump (P-1B-041 from RIKEN SEIKI CO., LTD). For the resultant sample, the peak area intensity ratio ((100)/(004)) of the (100) plane to the (004) plane of the BN primary particles was obtained by using the same apparatus as that used for the powder X-ray diffraction measurement. The result is shown in Table 1.

Thermal Conductivity in Thickness Direction of Moulded Body

The heat diffusivity in the thickness direction of the moulded body was obtained from the measurement by using a heat diffusivity measurement apparatus "ai-Phase Mobile 1u" from ai-Phase Co., Ltd., based on the following formula, thermal conductivity in thickness direction of moulded body=thermal diffusivity in thickness direction of moulded body×specific gravity of moulded body×specific heat of moulded body.

Production of Agglomerated BN Particles, Resin Composition Including Agglomerated BN Particles, and Moulded Body Thereof Example 1

<Fabrication of Agglomerated BN Particles from BN Slurry>
[Preparation of BN Slurry (Slurry A)]
(Raw Material)
raw material h-BN powder (width at half maximum of (002) plane peak obtained by the powder X-ray diffraction measurement is 2θ=0.67°, oxygen concentration is 7.5% by mass): 10000 g
binder ("Takiceram M160L" from TAKI CHEMICAL CO., LTD., solid content concentration is 21% by mass): 11496 g surfactant (surfactant "ammonium laurylsulfate" from Kao Corporation, solid content concentration is 14% by mass): 250 g
(Preparation of Slurry)
A predetermined amount of the raw material h-BN powder was weighed into a bottle made of resin, to which was then added a predetermined amount of the binder. Further, a predetermined amount of the surfactant was added, followed by addition of a ceramic zirconia ball, to stir for one hour on a pot mill rotation table.
The viscosity of the slurry was 810 mPa·s.
[Granulation]
Granulation from the BN slurry was carried out by using FOC-20 from OHKAWARA KAKOHKI CO., LTD. at a disk rotation speed of 20000-23000 rpm and a drying temperature of 80° C. to yield spherical agglomerated BN particles.
[Fabrication of Agglomerated BN Particles (Agglomerated BN-A Particles)]
The above-mentioned BN granulated particles were vacuumized at room temperature, and then, nitrogen gas was introduced for recovering pressure, and then, the temperature was raised up to 2000° C. at a rate of 83° C./hour with the nitrogen gas kept introduced, and after the temperature reached 2000° C., the particles were left for 5 hours with nitrogen gas still kept introduced. Then, the particles were cooled down to room temperature, to yield spherical agglomerated BN-A particles having a card-house structure.
[Classifying]
Then, the agglomerated BN-A particles subjected to the heating treatment were triturated mildly by using a mortar and a pestle, followed by classifying by using a sieve having an opening size of 90 μm. After classified, the agglomerated BN-A particles were subjected to the measurement of the average crystallite size of the BN primary particles constituting the agglomerated BN-A particles, the peak intensity ratio ((100)/(004)) of the (100) plane to the (004) plane of the BN primary particles, and the $D_{50}$ of the agglomerated BN-A particles. The measurement result is shown in Table 1.
<Production of Sheet of Moulded Body>
The above obtained agglomerated BN-A particles were used as a filler to prepare a resin composition including agglomerated BN particles which includes the filler and a resin composition.

[Resin Composition]
Epoxy resins from Mitsubishi Chemical Corporation, "157S70", "828US", and "4275" and a curing agent from Shikoku Chemicals Corporation Ltd. "C11Z-CN" were mixed at a ratio of "157S70":"828US":"4275":"C11Z-CN"=1:0.25:0.25:0.11 (mass ratio), to yield a resin composition.
[Preparation of Resin Composition Including Agglomerated BN Particles]
The BN-A (agglomerated BN particles) and the resin composition were combined so that the filing quantity of the agglomerated BN-A particles (the content proportion of the agglomerated BN-particles with respect to the resin composition and the agglomerated BN-A particles in total) was 80% by mass.
Hundred parts by mass of the prepared mixture of resin composition/agglomerated BN-A particles and 50 parts by mass of methylethyl ketone were put into a polypropylene cup with a cap, and then, 6 parts by mass of 1-cyanoethyl-2-undecyl imidazole (curing agent) with respect to 100 parts by mass of the resin composition component was added and stirred by a planetary stirrer ("THINKY MIXER (Awatori rentarou) AR-250" from THINKY CORPORATION)), to prepare a coating liquid of the resin composition including agglomerated BN particles.
[Application of Coating Liquid]
The resultant coating liquid of the resin composition including agglomerated BN particles was applied on a copper substrate having a thickness of 100 μm and a size of 10 cm×20 cm by using a bar coater having a gap spacing of 400 μm ("Auto Film Applicator" from TESTER SANGYO CO., LTD.). Then the liquid was vacuum-dried at 50° C. for 30 minutes to form a coating film on the copper substrate.
[Production of Moulded Body]
The copper plate having the resultant coating film formed thereon was cut into a size of 4 cm square. It was placed in a metal mold, which was hot-pressed at 130° C. and 500 kg/cm² for 3 minutes, and further cured in an oven at 160° C. for 2 hours, to yield a moulded body (4 cm×4 cm) for evaluation of thermal conductivity. The measurement result is shown in Table 1.

Example 2

Spherical agglomerated BN particles having a card-house structure (agglomerated BN-B), a resin composition including agglomerated BN particles, and a moulded body thereof were fabricated in the same manner as that in Example 1, except that the slurry A in Example 1 was replaced with a BN slurry (slurry B) having a combination ratio of the raw material changed as described below. The measurement result is shown in Table 1.
[BN Slurry (Slurry B)]
(Raw Material)
raw material h-BN powder: 10000 g
pure water: 7500 g
binder: 5750 g
surfactant: 250 g
(Preparation of Slurry)
A predetermined amount of the raw material h-BN powder was weighed into a bottle made of resin, to which were then added the pure water and the binder in the mentioned order. Further, a predetermined amount of the surfactant was added, followed by addition of a ceramic zirconia ball, to stir for 1 hour on a pot mill rotation table. The viscosity of the slurry was 2200 mPa·s.

Example 3

Spherical agglomerated BN particles having a card-house structure (agglomerated BN-C), and a resin composition including the agglomerated BN particles, and a moulded body thereof were fabricated in the same manner as that in Example 1, except that the slurry A in Example 1 was replaced with a BN slurry (slurry C) having a combination ratio of the row material changed as described below. Measurement result is shown in Table 1.
[BN Slurry (Slurry C)]
(Raw Material)
raw material h-BN powder: 10000 g
binder: 11496 g
surfactant: 250 g
(Preparation of Slurry)
A predetermined amount of the raw material h-BN powder was weighed into a bottle made of resin, to which was then added a predetermined amount of the binder. Further, a predetermined amount of the surfactant was added, followed by a ceramic zirconia ball, to stir for 1 hour on a pot mill rotation table. The viscosity of the slurry was 1600 mPa·s.

Comparative Example 1

Agglomerated BN particles (agglomerated BN-D particles) and a resin composition including agglomerated BN particles, and a moulded body thereof were fabricated in the same manner as that in Example 2, except that the slurry B in Example 2 was replaced with a slurry D having a changed combination ratio of the raw material. The viscosity of the slurry was 155 mPa·s. The measurement result is shown in Table 1.
[BN Slurry (Slurry D)]
Combination of Slurry D
(Raw Material)
raw material h-BN powder: 2400 g
pure water: 2199 g
binder: 1380 g
surfactant: 60 g Comparative Example 2

Preparation of slurry and granulation were carried out in the manner similar as that in Example 1, and agglomerated BN particles were fabricated in the same manner as that in Example 1, except that sintering temperature was 1300° C. and the duration was 24 h in fabrication of agglomerated BN particles (agglomerated BN-E). The agglomerated BN particles were used to fabricate a resin composition including agglomerated BN particles and to produce a moulded body thereof in the same manner as that in Example 1. The result is shown in Table 1.

Comparative Example 3

A resin composition including agglomerated BN particles and a moulded body thereof were produced in the same manner as that in Example 1, except that PTX60 from Momentive was used in place of the agglomerated BN-A particles of Example 1. The result is shown in Table 1.

Comparative Example 4

The sample was prepared in the same manner as that in Example 1, except that PTX25 from Momentive was used in place of the agglomerated BN-A particles of Example 1. The result is shown in Table 1.

Comparative Example 5

A resin composition including agglomerated BN particles and a moulded body thereof were produced in the same manner as that in Example 1, except that SGPS from DENKI KAGAKU KOGYO KABUSHIKI KAISHA was used in place of the agglomerated BN-A particles of Example 1. The result is shown in Table 1.

Comparative Example 6

A resin composition including agglomerated BN particles and a moulded body thereof were produced in the same manner as that in Example 1, except that CTS7M from Saint-Gobain S.A. was used in place of the agglomerated BN-A particles of Example 1. The result is shown in Table 1.

Comparative Example 7

Preparation of slurry and granulation were carried out in the same manner as that in Example 1, and agglomerated BN particles were fabricated in the same manner as that in Example 1, except that sintering temperature was 1600° C. and the duration was 24 h in fabrication of agglomerated BN particles (agglomerated BN-F). The agglomerated BN particles were used to fabricate a resin composition including agglomerated BN particles and to produce a moulded body thereof in the same manner as that in Example 1. The result is shown in Table 1.

Comparative Example 8

Preparation of the example were carried out in the same manner as that in Example 1, except the slurry B in Example 2 was replaced to a BN slurry having a combination ratio of the raw material changed as follows (slurry E).
[BN Slurry (Slurry E)]
(Raw Material)
raw material h-BN powder: 10000 g
pure water: 7750 g
binder: 5750 g
(Preparation of Slurry)
A predetermined amount of the raw material h-BN powder was weighed into a bottle made of resin, to which were then added predetermined amounts of the pure water and the binder in the mentioned order. Further, a ceramic zirconia ball was added to stir for 1 hour on a pot mill rotation table. The viscosity of the slurry was 8000 mPa·s.

TABLE 1

| | Filler | | | | | | | | filling quantity | |
|---|---|---|---|---|---|---|---|---|---|---|
| | agglomerated particle | viscosity of slurry (mPa·s) | structure | average particle diameter of agglomerated BN particle $D_{50}$ (μm) | specific area (m²/g) | average crystallite size of BN particle (Å) | peak intensity ratio of BN primary particle (100)/(004) | peak area intensity ratio of BN primary particle (100)/(004) | of agglomerated BN particle (% by mass) | thermal conductivity (W/mK) |
| Example 1 | BN-A | 810 | card-house | 50 | 5.92 | 415 | 3.6 | 0.96 | 80 | 15.0 |
| Example 2 | BN-B | 2200 | card-house | 54 | 7.06 | 383 | 3.9 | 0.91 | 80 | 17.4 |
| Example 3 | BN-C | 1600 | card-house | 40 | 3.95 | 456 | 3.4 | 0.90 | 80 | 15.0 |
| Comparative example 1 | BN-D | 155 | card-house | 5 | 22.9 | 250 | 6.0 | 0.77 | 80 | 11.0 |
| Comparative example 2 | BN-E | 810 | card-house | 50 | 12.7 | 153 | 5.7 | 1.61 | 80 | 3.2 |
| Comparative example 3 | PTX60 | — | non-card-house | 60 | 5.8 | 370 | 2.8 | 0.21 | 80 | 11.4 |
| Comparative example 4 | PTX25 | — | non-card-house | 25 | 5.6 | 537 | 1.4 | 0.05 | 80 | 8.8 |
| Comparative example 5 | SGPS | — | non-card-house | 12 | — | 648 | — | 0.18 | 80 | 9.3 |
| Comparative example 6 | CTS7M | — | non-card-house | 120 | — | 305 | — | 0.12 | 80 | 10.7 |
| Comparative example 7 | BN-F | 810 | card-house | 47 | 7.32 | 161 | 3.9 | 0.97 | 80 | 8.8 |
| Comparative example 8 | — | 8000 | — | Not granulatable | — | — | — | — | — | — |

Evaluation of Peak Area Intensity Ratio of (100)/(004) Planes of BN Primary Particles in Moulded Body Obtained by Compressing Agglomerated BN Particles Example 4

A powder pellet moulding machine (10 mmφ) was filled with about 0.2 g of agglomerated BN-A particles fabricated in Example 1, which were then moulded into a pellet by using a hydraulic hand pump (P-1B-041 from RIKEN SEIKI CO., LTD.) at various press pressures described in Table 2. For the resultant samples, the peak area intensity ratio ((100)/(004)) of the (100) plane to the (004) plane of the BN primary particles was obtained by using the same apparatus as that used for the powder X-ray diffraction measurement. The result is shown in Table 2.

Example 5

The peak area intensity ratio ((100)/(004)) of the (100) plane to the (004) plane of the BN primary particles was obtained in the same manner as that in Example 4, except that agglomerated BN-B particles fabricated in Example 2 were used as agglomerated BN particles of about 0.2 g filled into the powder pellet moulding machine (10 mmφ). The result is shown in Table 2.

Comparative Example 9

The peak area intensity ratio ((100)/(004)) of the (100) plane to the (004) plane of the BN primary particles was obtained in the same manner as that in Example 4, except that the agglomerated BN-E particles were used as agglomerated BN particles. The result is shown in Table 2.

Comparative Example 10

The peak area intensity ratio ((100)/(004)) of the (100) plane to the (004) plane of the BN primary particles was obtained in the same manner as that in Example 4, except that agglomerated PTX60 particles from Momentive were used as agglomerated BN particles. The result is shown in Table 2.

Comparative Example 11

The peak area intensity ratio ((100)/(004)) of the (100) plane to the (004) plane of the BN primary particles was obtained in the same manner as that in Example 4, except that agglomerated PTX25 particles from Momentive were used as agglomerated BN particles. The result is shown in Table 2.

Comparative Example 12

The peak area intensity ratio ((100)/(004)) of the (100) plane to the (004) plane of the BN primary particles was obtained in the same manner as that in Example 4, except that SGPS from DENKI KAGAKU KOGYO KABUSHIKI KAISHA were used as agglomerated BN particles. The result is shown in Table 2.

Comparative Example 13

The peak area intensity ratio ((100)/(004)) of the (100) plane to the (004) plane of the BN primary particles was obtained in the same manner as that in Example 4, except that CTS7M from Saint-Gobain S.A. were used as agglomerated BN particles. The result is shown in Table 2.

Comparative Example 14

The peak area intensity ratio ((100)/(004)) of the (100) plane to the (004) plane of the BN primary particles was obtained in the same manner as that in Example 4, except that agglomerated BN-F particles were used as agglomerated BN particles. The result is shown in Table 2.

TABLE 2

| | filler | | | |
|---|---|---|---|---|
| | agglomerated BN particle | average crystallite size of BN primary particle (Å) | pellet-moulding pressure (ton/cm²) | peak area intensity ratio of BN primary particle (100)/(004) |
| Example 4 | BN-A | 415 | 0.85 | 0.96 |
| | | | 1.69 | 0.92 |
| | | | 2.54 | 0.77 |
| Example 5 | BN-B | 383 | 0.85 | 0.91 |
| | | | 1.69 | 0.74 |
| | | | 2.54 | 0.65 |
| Comparative example 9 | BN-E | 153 | 0.85 | 1.61 |
| | | | 1.69 | 1.53 |
| | | | 2.54 | 1.24 |
| Comparative example 10 | PTX60 | 370 | 0.85 | 0.20 |
| | | | 1.69 | 0.18 |
| | | | 2.54 | 0.16 |
| Comparative example 11 | PTX25 | 537 | 0.85 | 0.05 |
| | | | 1.69 | — |
| | | | 2.54 | 0.05 |
| Comparative example 12 | SGPS | 648 | 0.85 | 0.18 |
| | | | 1.69 | 0.17 |
| | | | 2.54 | 0.16 |
| Comparative example 13 | CTS7M | 305 | 0.85 | 0.12 |
| | | | 1.69 | 0.10 |
| | | | 2.54 | 0.10 |
| Comparative example 14 | BN-F | 161 | 0.85 | 0.97 |
| | | | 1.69 | 0.82 |
| | | | 2.54 | 0.68 |

Table 1 shows that the moulded bodies exhibit high thermal conductivity by using the agglomerated BN particles of the present invention. Comparative examples 1 and 2 in which the average crystallite diameters are less than 375 Å exhibit low thermal conductivity, and Comparative example 4 also cannot achieve high thermal conductivity, in which, the peak intensity ratio ((100)/(004)) of the (100) plane to the (004) plane of the BN primary particles obtained by subjecting agglomerated BN particles to the powder X-ray diffraction measurement is lower than 3 in spite of the average crystallite size exceeding 375 Å. Thus, the agglomerated BN particles of the present invention exhibit an unprecedented performance as a thermal conductivity filler and can be widely applicable to various use applications, for example, electric and electronic fields which suffer many thermal problems, the agglomerated BN particles having 375 Å or more of the average crystallite size of BN primary particles constituting agglomerated BN particles and 3 or more of the peak intensity ratio ((100)/(004)) of the (100) plane to the (004) plane of BN primary particles obtained by the powder X-ray diffraction measurement.

Further, according to the results of Table 1 and Table 2, a sheet exhibiting high thermal conductivity in the thickness direction can be obtained by using agglomerated particles having 0.25 or more of the peak area intensity ratio ((100)/(004)) of the (100) plane to the (004) plane of the BN primary particles and 375 Å or more of the average crystallite size of BN primary particles, even above a specific pressure.

Hereinafter, Examples according to another aspect of the present invention (second summaries) will be explained.

Measurement conditions in Examples will be described below, and for conditions other than those described below, the previously explained measurement conditions were used.

Peak Intensity Ratio of (100)/(004) Planes of BN Primary Particles:

It was calculated from the peak intensity ratio ((100)/(004)) of (100) plane to (004) plane of BN primary particles obtained by subjecting the agglomerated BN particles to the powder X-ray diffraction measurement.

Peak Area Intensity Ratio (100)/(004) of BN Primary Particles:

A powder pellet moulding machine (10 mm p) was filled with about 0.2 g of powder, which was then moulded into a pellet by using a hydraulic hand pump (P-1B-041 from RIKEN SEIKI CO., LTD) at a press pressure of 0.85 ton/cm², to yield a sample to be subjected to the measurement. The corresponding peak area intensity ratio can be calculated from the measurement carried out by using a powder X-ray diffractometer, X'Pert Pro MPD from PANalytical B.V. in the Netherlands.

X-Ray Diffraction Measurement of Heat Dissipation Sheet:

An X-ray diffractometer from PANalytical B.V. (X'Pert Pro MPD) was used. A press-moulded heat dissipation sheet was used as a sample. The measurement conditions are described below.

sample holder: non-reflective sample plate target: CuKα power: 40 kV and 30 mA measurement range: 5-100° step angle: 0.016° sweeping rate: 0.05°/sec variable slit 10 mm

Peak Intensity Ratio of (100)/(004) Planes of Heat Dissipation Sheet:

The peak intensity ratio ((100)/(004)) of the (100) plane to the (004) plane of BN primary particles was calculated from a result obtained by subjecting the heat dissipation sheet to the X-ray diffraction measurement.

Peak Area Intensity Ratio (100)/(004) of Heat Dissipation Sheet:

The peak area intensity ratio ((100)/(004)) of the (100) plane to the (004) plane of the BN primary particles was calculated from a result obtained by subjecting the heat dissipation sheet to the X-ray diffraction measurement.

Average Crystallite Diameter of BN Primary Particles in Heat Dissipation Sheet:

The measurement is in accordance with the above-mentioned measurement method of the average crystallite size of BN primary particles.

Adhesiveness Test:

The heat dissipation sheet formed by application on a substrate was cut into a size of 25 mm×60 mm, and then bonded to a substrate having a size of 25 mm×110 mm by heat press to form a measurement sample, which was fixed to a resin plate to be subjected to a 90° peel test. The test was carried out by using STA-1225 from ORIENTEC Co., Ltd.

Example 6

A slurry for heat dissipation sheet was prepared by mixing 4.7 g of agglomerated BN particles, BN-A, having a card-house structure, 1.6 g of boron nitride, PTX25 (from Momentive Ltd., 19.8 μm of $D_{50}$, 1.4 of peak intensity ratio of (100)/(004) planes of BN primary particles, 537 Å of average crystallite size of BN primary particles) which has a non-card-house structure, 2.12 g of epoxy resin (Tg: 190° C.) including 16.7% by mass of phenoxy resin including bisphenol A type phenoxy resin with respect to the total amount of the epoxy resin, 6.2 g of a solvent (cyclohexanone/methylethyl ketone), 0.41 g of a dispersant (trade name of BYK-2155, from BYK Japan KK), and 0.13 g of 1-cyanoethyl-2-undecyl imidazole (trade name of C11Z-CN, from Shikoku Chemicals Corporation Ltd.).

The prepared slurry for heat dissipation sheet was applied on a substrate by the doctor blade method, and then heated by dryness, followed by press to yield a heat dissipation sheet of about 200 μm in sheet thickness.

Example 7

A slurry for heat dissipation sheet was prepared by mixing 4.7 g of agglomerated BN particles, BN-A, having a card-house structure, 1.6 g of boron nitride, PTX25, (from Momentive Ltd., 19.8 μm of $D_{50}$, 1.4 of peak intensity ratio of (100)/(004) planes of BN primary particles, 537 Å of average crystallite size of BN primary particles) which has a non-card-house structure, and 2.12 g of epoxy resin (Tg: 31° C.) including 20% by mass of phenoxy resin including bisphenol F type phenoxy resin with respect to the total amount of the epoxy resin, 6.2 g of a solvent (cyclohexanone/methylethyl ketone), 0.41 g of a dispersant (trade name of BYK-2155, from BYK Japan KK), and 0.13 g of 1-cyanoethyl-2-undecyl imidazole (trade name of C11Z-CN, from Shikoku Chemicals Corporation Ltd.).

The prepared slurry for heat dissipation sheet was applied on a substrate by the doctor blade method, and then heated by dryness, followed by press to yield a heat dissipation sheet of about 200 μm in sheet thickness.

Example 8

A slurry for heat dissipation sheet was prepared by mixing 5.5 g of agglomerated BN particles, BN-A, ($D_{50}$: 50 μm) having a card-house structure, 1.8 g of agglomerated BN particles, BN-D, ($D_{50}$: 14 μm) having a card-house structure, 1.0 g of epoxy resin (Tg: 190° C.), 6.2 g of a solvent (cyclohexanone/methylethyl ketone), 0.40 g of a dispersant (trade name of BYK-2155, from BYK Japan KK), and 0.06 g of 1-cyanoethyl-2-undecyl imidazole (trade name of C11Z-CN, Shikoku Chemicals Corporation Ltd.).

Figure 5:
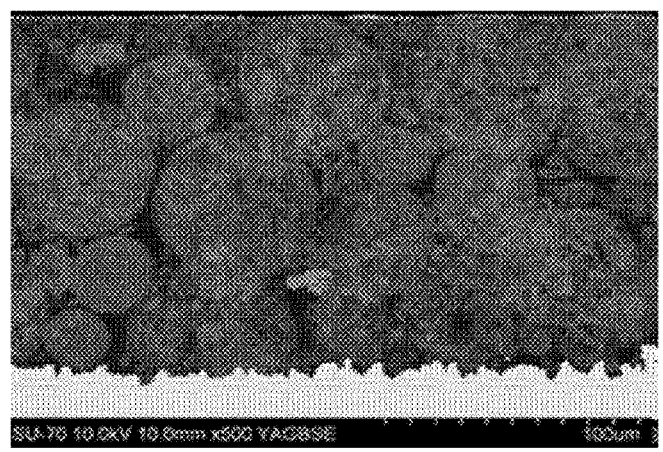
FIG. 5 is a cross sectional SEM photograph of a sheet including agglomerated BN particles obtained in Examples.

The prepared slurry for heat dissipation sheet was applied on a substrate by the doctor blade method, and then heated by dryness, followed by press to yield a heat dissipation sheet of about 200 μm in sheet thickness. The thermal conductivity, voltage resistance, and X-ray diffraction of the obtained heat dissipation sheet were measured. At this time, the sheet press pressure was 300 kg-weight/cm², and FIG. 5 is a SEM photograph of the cross section of the sheet. One of the reasons why the effect of the present invention is exhibited is that, as shown therein, the agglomerated BN particles of the present invention keep their shape of powder before press even after the press at the above-mentioned press pressure. More specifically, as shown in FIG. 5, the sheet is such that the agglomerated BN particles can be observed as agglomerated particles at the sheet press pressure of 300 kg-weight/cm², and in particular, such that a card-house structure can be also observed.

Comparative Example 15

A slurry for heat dissipation sheet was prepared by mixing 4.6 g of boron nitride, PTX60, (from Momentive Ltd., 55.8 μm of $D_{50}$, 2.8 of peak intensity ratio of (100)/(004) planes of BN primary particles, 370 Å of average crystallite size of BN primary particles) which has a non-card-house structure, 1.5 g of boron nitride, PTX25, (from Momentive Ltd., 19.8 μm of $D_{50}$, 1.4 of peak intensity ratio of (100)/(004) planes of BN primary particles, 537 Å of average crystallite size of BN primary particles) which has a non-card-house structure, 2.1 g of epoxy resin (Tg: 190° C.), 7.2 g of a solvent (cyclohexanone/methylethyl ketone), 0.40 g of a dispersant (trade name of BYK-2155, from BYK Japan KK), and 0.13 g of 1-cyanoethyl-2-undecyl imidazole (trade name of C11Z-CN, from Shikoku Chemicals Corporation Ltd.).

The prepared slurry for heat dissipation sheet was applied on a substrate in the same manner as that in Example 6 by the doctor blade method, and then heated by dryness, followed by press to yield a heat dissipation sheet of about 200 μm in sheet thickness. The thermal conductivity, voltage resistance, and X-ray diffraction of the obtained heat dissipation sheet were measured.

Comparative Example 16

A slurry for heat dissipation sheet was prepared by mixing 5.5 g of boron nitride, PTX60, (from Momentive Ltd., 55.8 μm of $D_{50}$, 2.8 of peak intensity ratio of (100)/(004) planes of BN primary particles, 370 Å of average crystallite size of BN primary particles which has a non-card-house structure, 1.8 g of agglomerated BN particles, BN-D, ($D_{50}$: 14 μm) which has a card-house structure, 1.0 g of epoxy resin (Tg: 190° C.), 6.1 g of a solvent (cyclohexanone/methylethyl ketone), 0.40 g of a dispersant (trade name of BYK-2155, from BYK Japan KK), and 0.06 g of 1-cyanoethyl-2-undecyl imidazole (trade name of C11Z-CN, from Shikoku Chemicals Corporation Ltd.).

The prepared slurry for heat dissipation sheet was applied on a substrate in the same manner as that in Example 6 by the doctor blade method, and then heated by dryness, followed by press to yield a heat dissipation sheet of about 200 μm in sheet thickness. The thermal conductivity, voltage resistance, and X-ray diffraction of the obtained heat dissipation sheet were measured.

The measurement results of the above-mentioned Examples 2, 6, 7, and 8, and Comparative examples 1, 15, and 16 are shown in Table 3.

TABLE 3

| | particle 1 | | particle 2 | | characterization of moulded body | | | | | |
|---|---|---|---|---|---|---|---|---|---|---|
| | | | | | Average crystallite size of BN primary particle in moulded body (Å) | peak intensity ratio (100)/ (004) | peak area intensity ratio (100)/ (004) | Thermal conductivity W/mK | Voltage resistance kV/mm | Adhesivity strength N/cm |
| | particle | structure | particle | structure | | | | | | |
| Example 2 | BN-B | card-house structure | — | — | 588 | 2.61 | 1.32 | 17.4 | 18.0 | — |
| Example 6 | BN-A | card-house structure | boron nitride PTX25 | non-card-house structure | 558 | 2.90 | 1.42 | 19.3 | 24.7 | 1.16 |
| Example 7 | BN-A | card-house structure | boron nitride PTX25 | non-card-house structure | — | — | — | 17.7 | 22.5 | 5.10 |
| Example 8 | BN-A | card-house structure | BN-D | card-house structure | — | — | — | 17.1 | 24.5 | — |
| Comparative example 1 | BN-D | card-house structure | — | — | 250 | 4.78 | 2.04 | 8.0 | — | — |
| Comparative example 3 | boron nitride PTX60 | non-card-house structure | — | — | 693 | 0.59 | 0.34 | 11.4 | — | — |
| Comparative example 6 | boron nitride CTS7M | non-card-house structure | — | — | >1000 | 0.27 | 0.18 | 10.7 | — | — |
| Comparative example 15 | boron nitride PTX60 | non-card-house structure | boron nitride PTX25 | non-card-house structure | 600 | 0.96 | 0.50 | 8.3 | 33.9 | — |
| Comparative example 16 | boron nitride PTX60 | non-card-house structure | BN-D | card-house structure | — | — | — | 10.6 | 24.4 | — |

Table 3 shows that, when the moulded bodies are in the form of a sheet from agglomerated BN particles specified in the present invention or obtained from compositions which are combinations of agglomerated BN particles satisfying the volume averaged particle diameter with, for example, inorganic particles having a smaller $D_{50}$, the moulded bodies including the particles have high thermal conductivity and high voltage resistance, thus yielding a moulded sheet having high heat dissipation performance and high voltage resistant performance. It is also shown that, when a moulded body includes inorganic particles and the agglomerated BN particles in which the peak intensity ratio of the (100)/(004) planes of the BN primary particles and the average crystallite size of the BN primary particles satisfy the specification of the present invention, the moulded body has high thermal conductivity and high voltage resistance, thus yielding a moulded sheet having a higher heat dissipation performance and a higher voltage resistant performance.

Although detailed mechanisms of the performances are not clear, a possible cause of, for example, the high heat dissipation performance is that the $D_{50}$s of the BN primary particles and the agglomerated BN particles were larger due to the used agglomerated BN particles, and boundary resistance between the primary particles and between agglomerated particles was able to be reduced. Further, when inorganic particles smaller than the agglomerated BN particles were used in combination, voids between larger particles were able to be efficiently reduced, resulting in the improved voltage resistant performance.

Fabrication Example of Insulating Circuit Board

A slurry for heat dissipation sheet was prepared by mixing 22.2 g of agglomerated BN particles, BN-A, having a card-house structure, 7.3 g of agglomerated boron nitride particles, BN-D, having a card-house structure, 6.7 g of epoxy resin (Tg: 190° C.), 21.3 g of a solvent (cyclohexanone/methylethyl ketone), 2.3 g of a dispersant (trade name of BYK-2155, from BYK Japan KK), and 0.24 g of 1-cyanoethyl-2-undecyl imidazole (trade name of C11Z-CN, from Shikoku Chemicals Corporation Ltd.).

The prepared insulating slurry for heat dissipation sheet was applied on copper foils (105 μm). Then, heated by dryness, the coated side of the one foil is stacked to that of another foil and pressed, to yield an insulating heat dissipation sheet having both sides covered with copper foils. The thickness of the film portion in the insulating heat dissipation sheet was about 300 μm.

Figure 4:
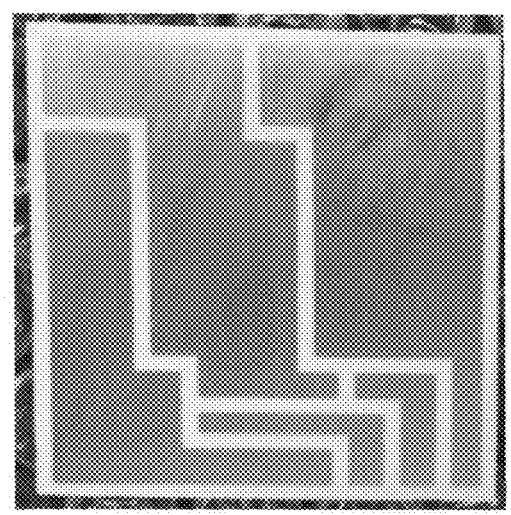
FIG. 4 is a photograph of patterns on an insulation circuit board obtained in Examples.

One side of this insulating heat dissipation sheet was etched for patterning to yield an insulation circuit board depicted in FIG. 4.

Figure 6:
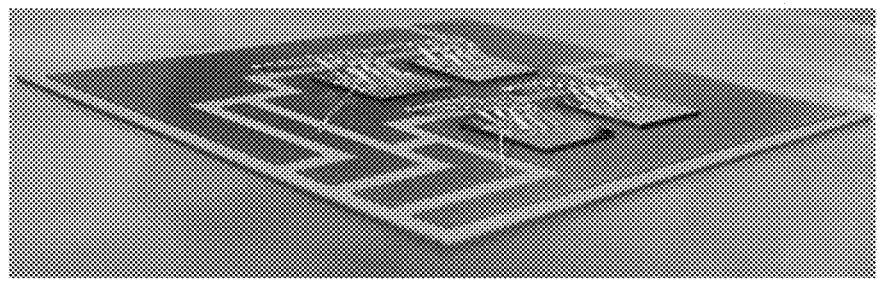
FIG. 6 is a photograph of the shape of a semiconductor device based on an insulation circuit board obtained in Examples.

Further, die bonding and wire bonding were carried out to fabricate a device. The result is depicted in FIG. 6.

INDUSTRIAL AVAILABILITY

The agglomerated BN particles of the present invention can be used to form a high quality heat dissipation sheet having high thermal conductivity required in, for example, power semiconductor devices. In addition, the composition including agglomerated BN particles of the present invention can be used to form a high quality heat dissipation sheet having high thermal conductivity required in, for example, power semiconductor devices.

The power semiconductor devices having the heat dissipation sheet are useful for fabrication of power semiconductor device using a highly efficient substrate, such as next generation SiC and GaN, enabling high temperature operation.

While the invention has been described in detail and with reference to specific embodiments thereof, it will be apparent to one skilled in the art that various changes and modifications can be made therein without departing from the spirit and scope thereof.

The invention claimed is:

1. An agglomerated boron nitride particle (hereinafter referred to as "agglomerated BN particle") constituted by boron nitride primary particles (hereinafter referred to as "BN primary particles"), wherein a peak area intensity ratio ((100)/(004)) of a (100) plane to a (004) plane of the BN primary particles is 0.25 or more, the peak intensity ratio being obtained by subjecting, to a powder X-ray diffraction measurement, a pellet-shaped sample moulded at a moulding pressure of 0.85 ton/cm$^2$ using a 10 mmφ powder pellet moulding machine, the average crystallite size of the BN primary particles obtained from a (002) plane peak of the BN primary particles is 375 Å or more, the average crystallite size being obtained as a result of filling a glass sample plate having a depth of 0.2 mm with the agglomerated BN particles in such a way that the sample surface becomes smooth, and subjecting the agglomerated BN particles to a powder X-ray diffraction measurement, and a specific surface area of the agglomerated BN particle is 8 m$^2$/g or less.

2. The agglomerated BN particle according to claim 1, wherein an average particle diameter $D_{50}$ of the agglomerated BN particle is 26 μm or more.

3. The agglomerated BN particle according to claim 1, wherein the agglomerated BN particle is spherical.

4. The agglomerated BN particle according to claim 1, wherein the agglomerated BN particle has a card-house structure.

5. A composition of the agglomerated BN particle which is a mixture of the agglomerated BN particle according to claim 1 and filler.

6. A resin composition comprising agglomerated BN particle, comprising resin and the agglomerated BN particles according to claim 1.

7. A moulded body comprising the agglomerated BN particle according to claim 1.

8. A method of producing the agglomerated BN particle according to claim 1, comprising:
  granulating slurry of raw material boron nitride powder (hereinafter referred to as "BN slurry"); and
  performing heating treatment, wherein in the granulating, a viscosity of the BN slurry is 200 mPa·s or more and 5000 mPa·s or less, and the heating treatment is performed at 1800° C. or more and 2300° C. or less.

9. The method according to claim 8, wherein an oxygen concentration in the raw material boron nitride powder is 1% by mass or more and 10% by mass or less.

10. A sheet comprising agglomerated boron nitride particles (hereinafter referred to as "agglomerated BN particles"),
  wherein a peak intensity ratio ((100)/(004)) of a (100) plane to a (004) plane of boron nitride primary particles (hereinafter referred to as "BN primary particles") in the sheet obtained by subjecting the sheet to an X-ray diffraction measurement is 1.0 or more,
  an average crystallite size of the BN primary particles obtained from a (002) plane peak of the BN primary particles in the sheet obtained by subjecting the sheet to an X-ray diffraction measurement is 375 Å or more, and a specific surface area of the agglomerated BN particle is 8 m$^2$/g or less.

11. The sheet according to claim 10, wherein the peak area intensity ratio ((100)/(004)) of the (100) plane to the (004) plane of the boron nitride primary particles (hereinafter referred to as "BN primary particles") in the sheet obtained by subjecting the sheet to an X-ray diffraction measurement is 0.6 or more.

12. A device comprising the sheet according to claim 10 as a part of a member of the device.

* * * * *